US006170622B1

(12) United States Patent
Wakui et al.

(10) Patent No.: US 6,170,622 B1
(45) Date of Patent: Jan. 9, 2001

(54) ANTI-VIBRATION APPARATUS AND ANTI-VIBRATION METHOD THEREOF

(75) Inventors: Shinji Wakui; Takehiko Mayama; Hiroaki Kato, all of Utsunomiya (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/035,982

(22) Filed: Mar. 6, 1998

(30) Foreign Application Priority Data

Mar. 7, 1997 (JP) .................................................. 9-068995
Jul. 28, 1997 (JP) .................................................. 9-215492

(51) Int. Cl.[7] ........................ F16F 15/023; F16F 15/027; F16F 15/03; G05D 19/02
(52) U.S. Cl. ........................ 188/378; 267/136; 248/550
(58) Field of Search ...................... 188/378, 379, 188/380, 1.11 E, 266.1; 267/136, 64.11, 64.28, 122; 248/550, 635, 631; 318/632, 618, 652, 568.17, 592, 611, 623, 600, 448; 108/136; 355/53; 73/149, 660–664; 356/400; 364/167.02

(56) References Cited

U.S. PATENT DOCUMENTS

| | | | |
|---|---|---|---|
| 5,504,407 | 4/1996 | Wakui et al. | 318/568 |
| 5,568,032 | 10/1996 | Wakui | 318/632 |
| 5,653,317 | 8/1997 | Wakui | 188/378 |
| 5,812,958 | 9/1998 | Mayama | 701/111 |
| 5,876,012 | * 3/1999 | Haga et al. | 248/550 |
| 5,881,987 | * 3/1999 | Hara | 267/136 |

FOREIGN PATENT DOCUMENTS 3-219141  9/1991  (JP) .
8-166043  6/1996  (JP) .

* cited by examiner

Primary Examiner—Douglas C. Butler
(74) Attorney, Agent, or Firm—Fitzpatrick, Cella, Harper & Scinto

(57) ABSTRACT

An anti-vibration apparatus is equipped with a plurality of active support legs which support an anti-vibration table and which are able to actively operate to control the motion of the anti-vibration table in a horizontal plane. The apparatus is further equipped with a pressure feedback loop for detecting the internal pressure of an air spring provided in each of the plurality of active support legs and for feeding a signal, which is based on the detected internal pressure of the air spring, back to the control system of the anti-vibration apparatus.

46 Claims, 23 Drawing Sheets

EXAMPLE OF MOUNTED LOAD MEASURER

LAYOUT AND DRIVE-AXIS DIRECTIONS OF ACTUATORS

FIG. 13 CONTROL BLOCK DIAGRAM SHOWING CONVENTIONAL FEEDBACK, STAGE REACTION FORCE FEEDFORWARD, AND FLOOR VIBRATION FEEDFORWARD

ANTI-VIBRATION APPARATUS AND ANTI-VIBRATION METHOD THEREOF

BACKGROUND OF THE INVENTION

The present invention relates to an active anti-vibration apparatus, such as for example, an air spring type active anti-vibration apparatus which employs air spring actuators and which is ideally used as a component unit of a semiconductor exposure apparatus with an exposure XY stage mounted thereon.

A group of equipment such as an optical microscope and an exposure XY stage which are susceptible to vibration is mounted on an anti-vibration table. The exposure XY stage, in particular, must be mounted on an anti-vibration table which is able to eliminate vibration transmitted from outside as much as possible in order to permit proper and quick exposure because exposure has to be carried out with the exposure XY stage completely stopped and still. The exposure XY stage has an operation mode in which the exposure XY stage performs intermittent movement known as "step-and-repeat". In this step-and-repeat mode, the stage itself repeatedly generates stepping vibration; therefore, considerations should be given to the vibration of the anti-vibration table caused by the foregoing stepping vibration.

If the vibration cannot be completely settled and if it remains, then exposure operation cannot be initiated. For this reason, the anti-vibration table is required to provide vibration controlling performance for eliminating external vibration and the vibration attributable to the motion of mounted equipment in a well balanced manner.

In recent years, a scan-type semiconductor exposure apparatus which irradiates exposure light to a silicon wafer while scanning an XY stage or the like is beginning to replace the step-and-repeat type semiconductor exposure apparatus which brings the XY stage to a complete halt, then irradiates exposure light to the silicon wafer mounted on the stage. The anti-vibration table used for such a scan-type apparatus is also required to provide controlling performance for eliminating external vibration and to control the vibration resulting from the motion of mounted equipment in a well-balanced manner.

As it is widely known, the anti-vibration tables are classified into passive type and active type. Recently, there has been a trend toward using active anti-vibration apparatuses to respond to the demand for highly accurate positioning, highly accurate scanning, quicker movement, etc., required of the equipment mounted on an anti-vibration table. Air springs, voice coil motors, piezo elements, etc., are known as the actuators employed for such anti-vibration apparatuses. A specific description will be given herein of an active anti-vibration apparatus as a conventional example using air springs as the actuators.

First, referring to FIG. 11, the configuration and operation of the active anti-vibration apparatus of the prior art, which employs air springs as the actuators, will be described. In FIG. 11, an anti-vibration table 1 on which precision equipment is mounted has active support legs 2a through 2d.

The active support legs 2a through 2d are primarily composed of air spring actuators which include vibration measurers 3a through 3d for measuring the vibration in the horizontal direction, air spring actuators 4a through 4d which include servo valves (not shown) for generating drive power in the horizontal direction, and displacement sensors 6a through 6d for measuring horizontal displacement. Acceleration sensors, geophone sensors, etc., may be used as the vibration measurers 3a through 3d. As the displacement sensors 6a through 6d, eddy current type displacement sensors, capacitive sensors, position sensors employing photoelectric converters, etc., may be used.

As shown in the drawing, the active support legs 2a through 2d which include, as primary composing elements thereof, the foregoing air spring actuators 4a through 4d, the displacement sensors 6a through 6d, and vibration measurers 3a through 3d, are disposed at the four corners of the anti-vibration table 1 to support the anti-vibration table 1 and the precision equipment mounted thereon. Although the main composing elements which perpendicularly support the anti-vibration table 1 are not shown, they share the same configuration as the aforesaid composing elements which horizontally support the anti-vibration table.

The configuration and operation of a decoupling feedback apparatus in each motional mode for the active support legs 2a through 2d of the control scheme of the active anti-vibration apparatus will now be described.

First, electrical output signals Aa through Ad of the vibration measurers 3a through 3d of an acceleration sensor or the like are supplied to a motional-mode selector 7A related to the acceleration for selecting the translation in the x-direction, the translation in the y-direction, and the rotation about the z-axis of the anti-vibration table 1. Based on the received electrical output signals, the motional-mode selector 7A issues motional mode acceleration signals ($a_x$, $a_y$, and $a\theta z$) which are turned into negative feedback signals related to the acceleration for each motional mode via gain compensators $17_x$, $17_y$, and $17_z$ which have appropriate amplification degrees and time constants; the negative feedback signals are sent back to the section preceding a motional-mode distributor 9. This acceleration feedback loop provides a damping operation for each motional mode to stabilize the operation of the anti-vibration table 1.

The electrical output signals Za through Zd of the displacement sensors 6a through 6d are supplied to error amplifiers 10a through 10d. Another type of inputs is supplied to the respective error amplifiers 10a through 10d from a position target voltage input terminal 11. The voltage applied to the input terminal represents the equilibrium position of the anti-vibration table 1 with respect to the foundation such as a floor on which the active support legs 2a through 2d are installed. Position error signals $e_a$ through $e_d$ which are the outputs of the error amplifiers 10a through 10d are applied to a motional-mode selector 7P so that the motional-mode selector 7P related to displacement issues motional mode error signals ($s_x$, $s_y$, and $s\theta z$) which are then applied to PI compensators $12_x$, $12_y$, and $12\theta z$ for setting the steady-state error to zero for each motional mode, thus making up a positional feedback loop. In this case, P denotes proportion and I denotes integrating operation.

Next, the output signals of the PI compensators $12_x$, $12_y$, and $12\theta z$ and the negative feedback signals related to the acceleration by motional mode which are issued from the gain compensators $17_x$, $17_y$, and $17_z$ are added to provide drive signals ($d_x$, $d_y$, and $d\theta z$). The drive signals ($d_x$, $d_y$, and $d\theta z$) by motional mode are applied to the motional-mode distributor 9 which generates drive signals to be sent to the respective axes. When the output signals ($d_a$, $d_b$, $d_c$, and $d_d$) of the motional-mode distributor 9 are supplied to voltage-current converters 8a through 8d of the respective axes, the servo valves (not shown) are opened or closed to regulate the internal pressures of the air spring actuators 4a through 4d; the changes in the internal pressures cause the applied voltage supplied from the position target voltage input terminal 11 to maintain the anti-vibration table 1 at a predetermined position without a steady-state error.

FIG. 12 is a top plan view showing the layout of the active support legs 2a through 2d related to the anti-vibration apparatus shown in FIG. 11. The twin-headed arrows entered in the respective support legs in the drawing indicate the directions in which the air spring actuators 4a through 4d can be driven and they also indicate the measurement directions of the vibration measurers 3a through 3d and the displacement sensors 6a through 6d. It can be easily understood that providing such driving directions and measuring directions permits the control of the translation in the x-direction, the translation in the y-direction, and the rotation about the z-axis.

Referring back to FIG. 11, an XY stage 13, which is a precision machine, is mounted on the anti-vibration table 1. The behavior of the XY stage 13 when it performs the step-and-repeat operation in the x-direction while repeatedly reversing the moving direction will be described, although the detailed description of the structure of the XY stage 13 will be omitted. The XY stage 13 mainly generates the translation in the x-direction and the rotary motion in the y-direction. For the rotary motion in the y-direction, the air spring actuator in the z-direction (not shown) generates driving power to eliminate and control the vibration of the stage. When the XY stage 13 reverses the direction of motion thereof, it is driven in the x-direction and y-direction, so that a drive reaction force is generated to produce a rotary motion about the z-axis. The observation result of the deformation or distortion of the structure including the anti-vibration table 1 has revealed that the deformation at that time is not negligible in ensuring the positioning accuracy of the XY stage 13 or wafer exposure for which a nanometer-level accuracy is required. As mentioned above, zeroing the acceleration and restoring and maintaining the anti-vibration table 1 to the equilibrium position are ensured by the acceleration and position feedback loops. The aforesaid deformation is caused by the failure to control the internal pressures of the air spring actuators 4a through 4d to a predetermined pressure level. This means that no consideration has been given to the changes in pressure. The changes in the internal pressures of the air spring actuators 4a through 4d are the changes in force, and the application of an imbalanced force results in the deformation of the structure including the anti-vibration table 1. The deformation disturbs the reading of measuring equipment (not shown) mounted on the structure including the anti-vibration table. For instance, if the apparatus shown in FIG. 11 is a semiconductor exposure apparatus, the deformation leads to distorted exposure of a wafer, resulting in markedly low productivity.

As a publicly known example of a solution to the problem described above, there is an anti-vibration apparatus disclosed in Japanese Patent application Laid-Open No. 8-166043. This anti-vibration apparatus, which is equipped with a plurality of load sensors, is characterized in that it controls the adjustment made by a height adjusting means in accordance with detection results of the load sensors so as to maintain the balance of a reaction force received from anti-vibration pads. The object of the apparatus is to solve the problem of the deteriorated positioning accuracy or the like of the stage on a surface plate, namely, an anti-vibration table, by controlling or reducing the deformation of the surface plate attributable to the reaction force. The technical means for restraining the deformation of a structure disclosed in the publication, however, is adapted to control the adjustment of vertical motion devices (3A through 3D) serving as the height adjusting means in accordance with the measurements of the load sensors (5A through 5D) by using signals described in the publication in order to maintain the balance of the reaction force received from vibration pads unchanged. This means that the measurements of the load sensors are employed as the target values supplied to a closed-loop system which is constituted by the height adjusting means serving as actuators. It is understood that the apparatus does not have a minor loop wherein the measurements of the load sensors are fed back in the closed-loop system. Further, electric and pneumatic dampers which are screw-driven are enumerated as the vertical motion devices. In the latter type, the target values to be supplied to the closed-loop system of a pneumatic damper are generated in accordance with the measurements of the load sensors and the generated target values are applied; however, the system responds very slowly. Hence, the apparatus has not been successful in restraining the changes in load resulting especially from the short-cycle intermittent motion of the step-and-repeat operation.

There has also been a prior art arrangement known as "stage reaction force feedforward art" in which signals synchronized with the driving timing of the XY stage 13 are subjected to appropriate signal processing to conduct feedforward on the active anti-vibration apparatus in order to restrain the reaction force produced when the stage is driven. There has been another prior art arrangement known as "floor vibration feedforward art" wherein the vibration of a floor is detected by using an appropriate floor vibration detecting means and the resulting signals are subjected to appropriate signal processing so as to carry out feedforward on the active anti-vibration apparatus thereby to control the transmission of the vibration of a foundation such as a floor on which the apparatus is installed onto the anti-vibration table via mechanism members. In both feedforward devices, however, it is required to design feedforward compensators by taking the drive characteristics of the active anti-vibration apparatus into account.

The conventional active anti-vibration apparatuses described above are provided with an acceleration feedback loop for imparting the damping effect and a positional feedback loop for maintaining the posture. However, the force applied to the structure including the anti-vibration table 1 supported by the active support legs 2a through 2d is not placed under the control by the feedback loops. Hence, if a mounted precision machine, e.g., the XY stage 13, performs sudden acceleration or deceleration on the anti-vibration table, a resulting intense reaction force is generated and causes a great change in the load on the anti-vibration table. This results in distortion of the structure. The absence of a feedback loop for compensating for the changes in pressure or load means the absence of a control means, thus adversely affecting the efforts in achieving zero acceleration and positional error signals in a steady state wherein the feedback loop exists. The deformation of the structure disturbs the reading on measuring equipment (not shown) mounted thereon or the reading on a laser interferometer (not shown) required for positioning the XY stage 13, leading to deteriorated exposure accuracy with resultant considerably poor productivity.

Another conventional example will be explained with reference to FIG. 15 which illustrates the configuration and operation of an active anti-vibration apparatus of the prior art, which employs air springs as the actuators. In FIG. 15, an anti-vibration table 101 on which precision equipment is mounted has active support legs 102a through 102c.

The active support legs 102a through 102c are primarily composed of air spring actuators which include vibration measurers 103a through 103c for measuring the vibration in the horizontal direction, air spring actuators 104a through 104c which include servo valves (not shown) for generating drive power in the horizontal direction, and displacement sensors 105a through 105c which measure horizontal displacement. Acceleration sensors, geophone sensors, etc., may be used as the vibration measurers 103a through 103c. As the displacement sensors 105a through 105c, eddy current type displacement sensors, capacitive sensors, position sensors employing photoelectric converters, etc., may be used.

As shown in the drawing, the active support legs 102a through 102c which include, as primary composing elements thereof, the foregoing air spring actuators 104a through 104c, the displacement sensors 105a through 105c, and vibration measurers 103a through 103c, are disposed at the three corners of the approximately triangular anti-vibration table 101 to support the anti-vibration table 101 and the precision equipment mounted thereon. Although the main composing elements which perpendicularly support the anti-vibration table 101 are not shown, they share the same configuration as the aforesaid composing elements which horizontally support the anti-vibration table.

The configuration and operation of a decoupling feedback apparatus in each motional mode for the active support legs 102a through 102c of the control scheme of the active anti-vibration apparatus will now be described.

First, electrical output signals Aa through Ac of the vibration measurers 3a through 3c of an acceleration sensor or the like are supplied to a motional-mode selector 106A related to the acceleration for selecting the translation in the x-direction, the translation in the y-direction, and the rotation about the z-axis of the anti-vibration table 1. Based on the received electrical output signals, the motional-mode selector 106A issues motional mode acceleration signals ($a_x$, $a_y$, and $a\theta z$) which are turned into negative feedback signals related to the acceleration for each motional mode via gain compensators $107_x$, $107_y$, and $107\theta z$ which have appropriate amplification degrees and time constants; the negative feedback signals are sent back to the section before a motional-mode distributor 111. This acceleration feedback loop provides a damping operation for each motional mode to stabilize the operation of the anti-vibration table 101.

The electrical output signals Za through Zc of the displacement sensors 105a through 105c are supplied to error amplifiers 108a through 108c. Another type of inputs is supplied to the respective error amplifiers 108a through 108c from a position target voltage input terminal 109. The voltage applied to the input terminal 109 represents the equilibrium position of the anti-vibration table 101 with respect to the foundation such as a floor on which the active support legs 102a through 102c are installed. Position error signals $e_a$ through $e_c$ which are the outputs of the error amplifiers 108a through 108c are applied to a motional-mode selector 106P related to displacement so that the motional-mode selector 106P issues motional mode error signals ($S_x$, $S_y$, and $S\theta z$) which are then applied to PI compensators $110_x$, $110_y$, and $110\theta z$ for setting the steady-state error to zero for each motional mode, thus making up a position feedback loop.

Next, the output signals of the PI compensators $110_x$, $110_y$, and $110\theta z$ and the negative feedback signals related to the acceleration by motional mode which are issued from the gain compensators $107_x$, $107_y$, and $107_z$ are added to provide drive signals ($d_x$, $d_y$, and $d\theta z$) by motional mode. The drive signals ($d_x$, $d_y$, and $d\theta z$) by motional mode are applied to the motional-mode distributor 111 which generates drive signals to be sent to the respective axes. When the output signals ($d_a$, $d_b$, and $d_c$) of the motional-mode distributor 111 energize voltage-current converters 112a through 112c of the respective axes, the servo valves (not shown) are opened or closed to regulate the internal pressures of the air spring actuators 104a through 104c; the changes in the internal pressures cause the applied voltage supplied from the position target voltage input terminal 109 to maintain the anti-vibration table 101 at a predetermined position without a steady-state error. Reference numeral 140 denotes an XY stage, which is precision equipment, although a detailed description thereof will be omitted.

FIG. 16 shows an example of the mechanical structure of an active support leg 102. In FIG. 16, reference numeral 113 corresponds to the anti-vibration table 101 of FIG. 2, and reference numeral 114 denotes a fastening plate for firmly joining the active support leg 102 and the anti-vibration table 113. The active support leg 102 includes an air spring 115V (H) of the perpendicular or horizontal direction, a multi-layer rubber member 116, an acceleration sensor 117V (H) of the perpendicular or horizontal direction, a position sensor 118V (H) of the perpendicular or horizontal direction, a servo valve 119V (H) of the perpendicular or horizontal direction for allowing air, which is a working fluid, to go in and out of the air spring, a pre-load coil spring 120 of the horizontal direction, a force pin 121, and a frame 122. Reference numeral 123 indicates a floor with which the active support leg 102 is in contact. When the active support leg 102 having such a mechanical structure is used to support the anti-vibration table 101, the following problems are posed.

(1) The vibration of the floor on which the active support leg 102 is installed is transmitted to the anti-vibration table 101 or 113 via the composing members. It cannot be expected, therefore, to achieve further improvement of the transmissibility, which is the transfer function of the vibration on the anti-vibration table 101 with respect to the floor vibration.

(2) In the case of a semiconductor exposure apparatus, the XY stage, which is a precision machine, is mounted on the anti-vibration table. When the XY stage is actuated, the reaction force from the repetitive operation thereof continues to be applied to the anti-vibration table 101. At this time, the actuator device in the active support leg 102 generates a driving force against the reaction force, causing the driving force to be applied also to the composing members. This in turn causes the composing members, which have been installed with limited rigidity, to deform or it generates local mechanical vibration, adversely affecting the performance of the semiconductor exposure apparatus.

(3) The driving force of the air spring actuator generated according to the reaction force arising from driving the XY stage causes the structure including the anti-vibration table to deform, spoiling the performance of the exposure performance of the semiconductor exposure apparatus.

To solve the problems described in (1) and (2) above, the active support leg must have a structure which minimizes the need for using the composing members so that the route along which the vibration of the floor is directly transmitted is cut off with resultant improved transmissibility with respect to the vibration of the floor. The absence of composing members makes it possible to obviate the deformation and mechanical resonance of the composing members which are caused by the reaction force generated by sudden acceleration of the XY stage on the anti-vibration table.

As an example of the configuration of the active support leg without the composing members, there has been known a so-called "push-pull disposition" wherein actuators, which are oriented in the direction of the operating axis and driven in the directions opposite from each other, are opposed to each other. The actuators disposed in the push-pull layout are known in the art. There is another example of the push-pull disposition in addition to that of the active anti-vibration apparatus. For example, a magnetic bearing shown in FIG. 17 supports a movable member 125 without touching it by using a pair of an electromagnet 124R and electromagnet 124L which are horizontally disposed against each other. In general, steady current is supplied to the electromagnets 124R and 124L; if the movable member 125 is displaced to the right, then a controller (not shown) supplies more current to the left electromagnet 124L, whereas it supplies less current to the right electromagnet 124R according to the displacement. This enables the movable member 125 to be placed in a predetermined position without contact.

Referring back to the case of the active anti-vibration apparatus, there is an active damping table disclosed in Japanese Patent application Laid-Open No. 3-219141 as an example of the prior art of the apparatus configuration in which air spring actuators are disposed in the push-pull layout. According to this example of the prior art, in the block circuit diagram of a first embodiment, a pair of right and left air springs are disposed such that the air from a pneumatic source is applied to one air spring at a predetermined bias via a servo valve and that the internal pressure of the other air spring is changed in response to control signals. According to the block circuit diagram of a second embodiment of the prior art, a pair of right and left air springs are configured such that control signals of 180 degrees reversed in phase are supplied to the respective air springs to control the two air springs in the same direction so as to double the control power.

From the discussion above, it can be seen that an active support leg should have air spring actuators disposed in the push-pull layout so as to provide the actuators with pressure feedback or load feedback in order to further improve transmissibility, restrain or reduce the deformation and mechanical resonance attributable to the drive force generated by active support legs, and control the deformation of a structure including an anti-vibration table. It has not yet been known, however, about a configuration which permits such pressure feedback or load feedback to the active support leg having a pair of air spring actuators.

It has been proposed to employ an active support leg having the push-pull structure wherein the air spring actuators are disposed against each other so as to control the transmission of the vibration of a floor and also to obviate the occurrence of local vibration or deformation in the active support leg caused by the drive reaction force of the XY stage.

However, the minimum necessary feedback structure for controlling the deformation of a structure caused by sudden acceleration of an XY stage in a horizontal direction and the structure of a control scheme for conducting pressure or load feedback to an active support leg having the push-pull structure have not yet been clearly established and they have not been implemented.

SUMMARY OF THE INVENTION

The present invention has been made in view of the prior art described above, and it is an object of the present invention to provide an anti-vibration apparatus and an anti-vibration method thereof which eliminate the vibration applied to an anti-vibration table and to prevent the deformation of a structure including the anti-vibration table and an apparatus mounted on the anti-vibration table.

To this end, according to the present invention, there is provided an anti-vibration apparatus for eliminating the vibration of an anti-vibration table, the anti-vibration apparatus including:

a plurality of active support legs which support the anti-vibration table and which are able to actively operate to control the motion of the anti-vibration table in a horizontal plane;

control means for controlling the operations of the plurality of active support legs; and a plurality of pressure detecting means for detecting the internal pressures of the air springs respectively provided on the plurality of active support legs, wherein the control means is equipped with a pressure feedback loop which feeds the signals based on detected internal pressures back to a control scheme of the control means to adjust the internal pressures in the air springs according to the internal pressures of the air springs detected by the plurality of pressure detecting means.

In a preferred form, the air springs provided on each of the plurality of active support legs are a pair of air springs, and the anti-vibration apparatus is further provided with a three- or four-way type servo valve to supply or exhaust air, which serves as the medium for operating the pair of air springs, to or from the air springs, wherein the pressure detecting means detects the differential pressure between the two air springs caused by the air supplied or exhausted by the servo valve, and the pressure feedback loop feeds a signal, which is based on the differential pressure detected by the pressure detecting means, back to the control scheme of the control means.

In this case, the pressure generated in each of the pair of air springs may be detected to calculate the differential pressure according to the detected pressures of the two air springs. Alternatively, the pressure generated in each of the pair of air springs may be detected and the signal based on the detected pressures of the two air springs may be fed back to the control scheme of the control means.

Alternatively, the anti-vibration apparatus may be provided with a plurality of load measuring means for detecting the load generated by the operation of the air springs provided on each of the plurality of active support legs, in place of the pressure detecting means, wherein the control means may be equipped with a load feedback loop for feeding a signal, which is based on the load measured by the plurality of load measuring means, back to the control scheme of the control means in order to adjust the load generated by the operation of the air springs.

In this case, preferably, the air springs equipped for each of the plurality of active support legs are a pair of air springs, and the anti-vibration apparatus is further provided with a three- or four-way type servo valve to supply or exhaust air, which serves as the medium for operating the pair of air springs, to or from the air springs, wherein the load measuring means detects the load generated by the operation of each of the pair of air springs, and the load feedback loop feeds a signal, which is based on the load measured by the load measuring means, back to the control scheme of the control means.

Preferably, any one of the foregoing cases is provided with vibration measuring means for measuring the vibration of the anti-vibration table; and position measuring means for measuring the position of the anti-vibration table, wherein the control means is equipped with an acceleration feedback loop for feeding a signal, which is based on the acceleration of the vibration of the anti-vibration table in accordance with the measurement result given by the vibration measuring means, back to the control scheme of the control means, and a position feedback loop for feeding a signal, which is based on the position of the anti-vibration table measured by the position measuring means, back to the control scheme of the control means.

According to another aspect of the present invention, there is provided an anti-vibration apparatus for removing the vibration of an anti-vibration table, the anti-vibration apparatus including:

a plurality of active support legs which support the anti-vibration table and which are able to actively operate to control the motion of the anti-vibration table in a horizontal plane by using air spring actuators;

control means for controlling the operations of the plurality of active support legs; and pressurizing force measuring means for measuring the pressurizing forces of the air spring actuators;

wherein the control means is equipped with a pressurizing force feedback loop for feeding a signal, which is based on a measured pressurizing force, back to the control scheme of the control means so as to adjust the pressurizing force of the air spring actuators in accordance with the output of the pressurizing force measuring means.

Preferably, the anti-vibration apparatus is further equipped with vibration measuring means for measuring the vibration of the anti-vibration table; and position measuring means for measuring the position of the anti-vibration table, wherein the control means is provided with an acceleration feedback loop for feeding a signal, which is based on the acceleration of the vibration of the anti-vibration table in accordance with the measurement result given by the vibration measuring means, back to the control scheme of the control means, and a position feedback loop for feeding a signal, which is based on the position of the anti-vibration table measured by the position measuring means, back to the control scheme of the control means, and the control means imparts damping to the anti-vibration table in accordance with the signal based on the acceleration and also places the anti-vibration table at a predetermined position according to the signal based on the position.

According to still another aspect of the present invention, there is provided an anti-vibration method for an anti-vibration apparatus, whereby the vibration of an anti-vibration table is eliminated by controlling the motion of a plurality of active support legs, which are able to actively operate, in a horizontal plane, the anti-vibration method including:

a pressure detecting step for detecting the internal pressure of an air spring provided in each of the plurality of active support legs; and a control step for feeding a signal, which is based on a detected internal pressure, back to a control scheme of the anti-vibration apparatus to adjust the internal pressures in the air spring according to the internal pressure of the air spring detected in the pressure detecting step.

Alternatively, the anti-vibration method may include a plurality of load measuring steps for detecting the load generated by the operation of the air spring provided on each of the plurality of active support legs, in place of the pressure detecting step; and a control step for feeding a signal, which is based on the loads measured in the load measuring steps, back to the control scheme of the anti-vibration apparatus in order to adjust the load generated by the operation of the air springs.

Further alternatively, the anti-vibration method for an anti-vibration apparatus, whereby the vibration of an anti-vibration table is eliminated by controlling the motion of a plurality of active support legs, which are able to actively operate by using air spring actuators, in the horizontal plane, includes:

a pressurizing force measuring step for measuring the pressurizing forces of the air spring actuators; and a control step for feeding signals, which are based on measured pressurizing forces, back to a control scheme of the anti-vibration apparatus to adjust the pressurizing forces of the air spring actuators according to the measurement results in the pressurizing force measurement step.

Preferably, the anti-vibration method further includes:

a vibration measurement step for measuring the vibration of the anti-vibration table; and a position measuring step for measuring the position of the anti-vibration table, wherein the control step conducts control to feed a signal, which is based on the acceleration of the vibration of the anti-vibration table in accordance with the measurement result given in the vibration measurement step, back to the control scheme of the anti-vibration apparatus, so as to impart damping to the anti-vibration table in accordance with the signal based on the acceleration, and also to feed a signal, which is based on the position of the anti-vibration table measured in the position measurement step, back to the control scheme of the anti-vibration apparatus thereby to place the anti-vibration table at a predetermined position in accordance with the signal based on the position.

BRIEF DESCRIPTION OF THE DRAWINGS

The invention will be understood more fully from the detailed description given here below and from the accompanying drawings of preferred embodiments of the invention, which, however, should not be considered as limiting the invention but are for explanation and understanding only.

DESCRIPTION OF THE PREFERRED EMBODIMENTS

The embodiments of the active anti-vibration apparatus in accordance with the present invention will now be described with reference to the accompanying drawings.

[First Embodiment]

Figure 1:
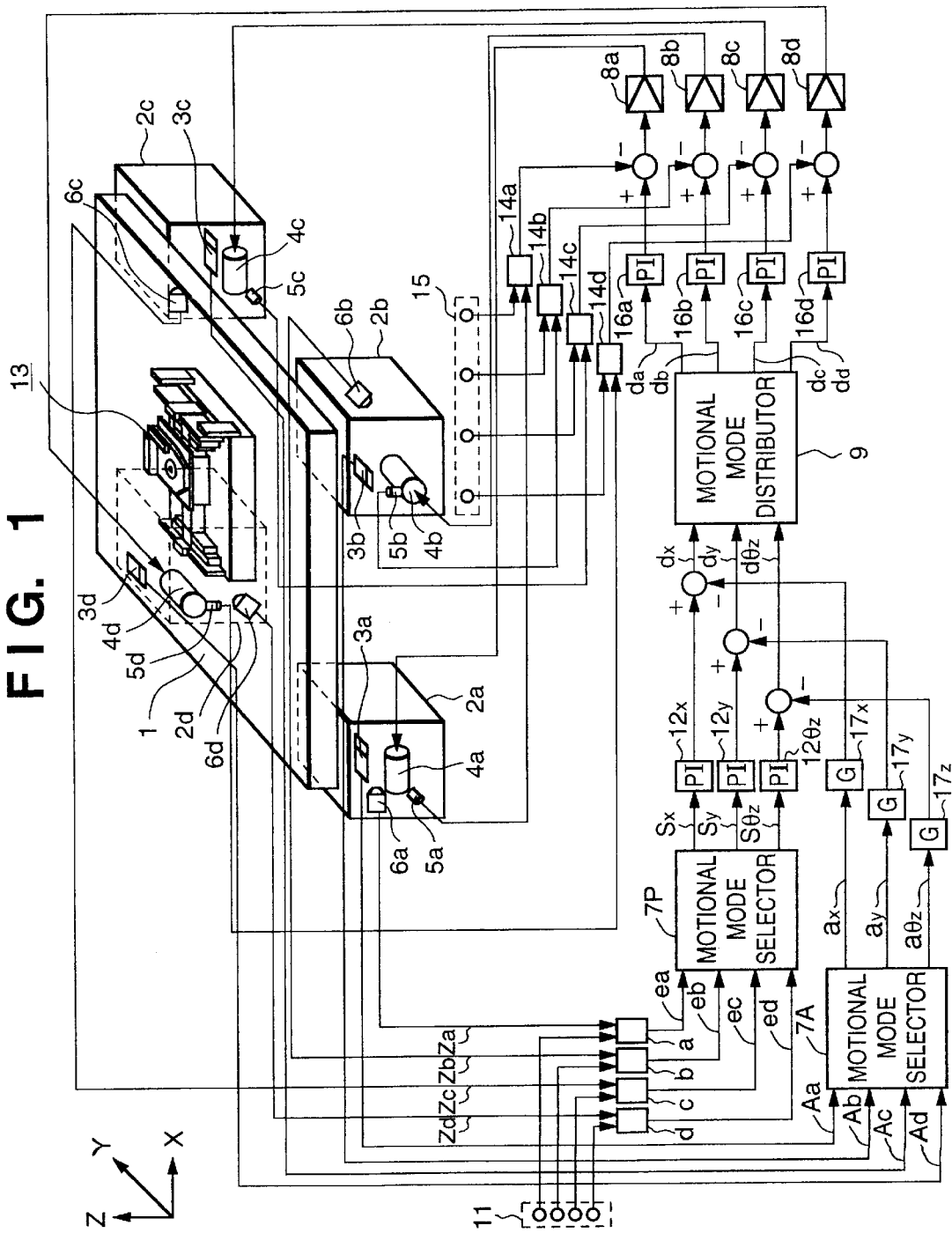
FIG. 1 is a block diagram of an active anti-vibration apparatus according to a first embodiment of the present invention.
Figure 11:
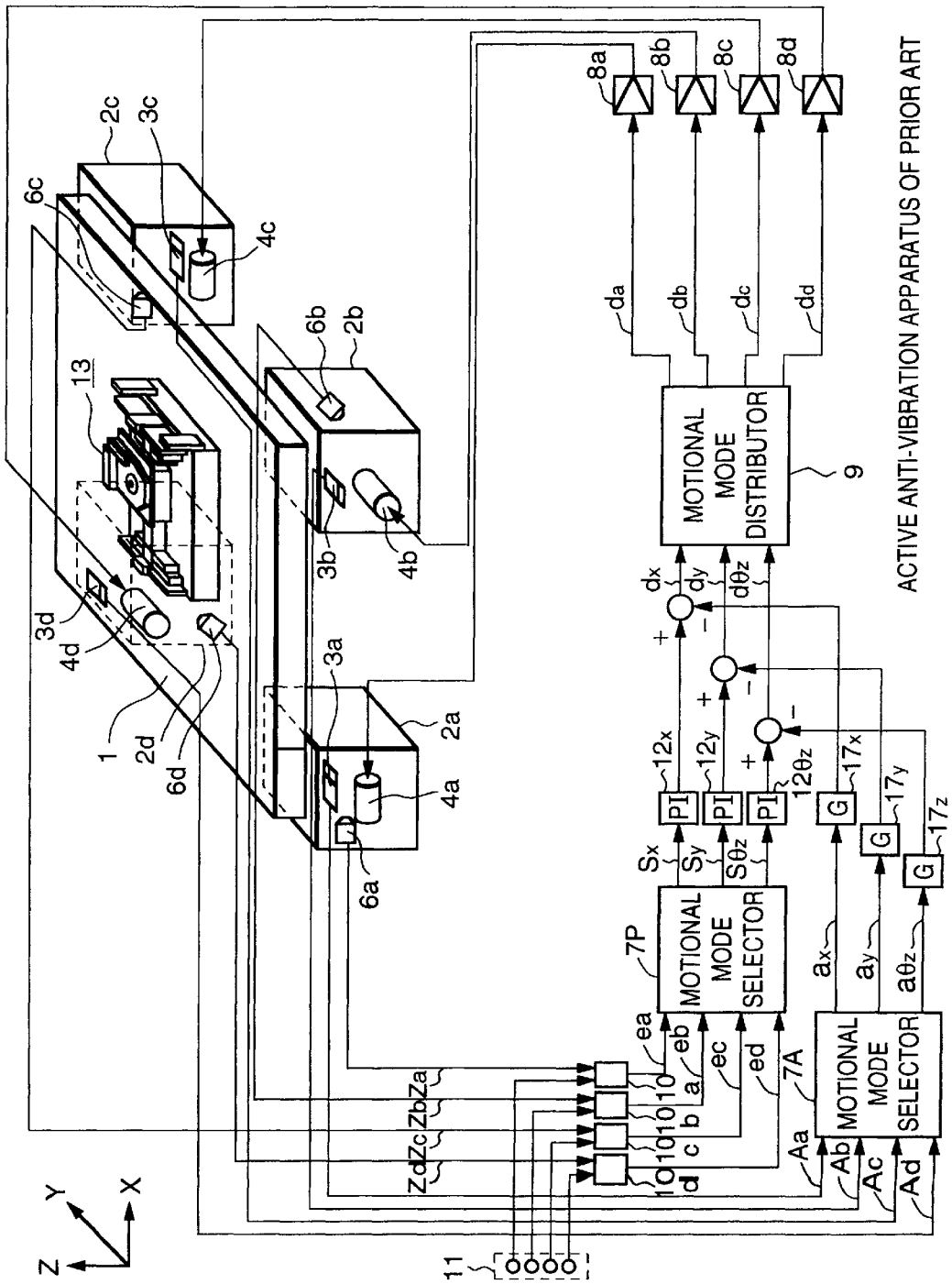
FIG. 11 is a block diagram of an active anti-vibration apparatus according to the prior art.
Figure 12:
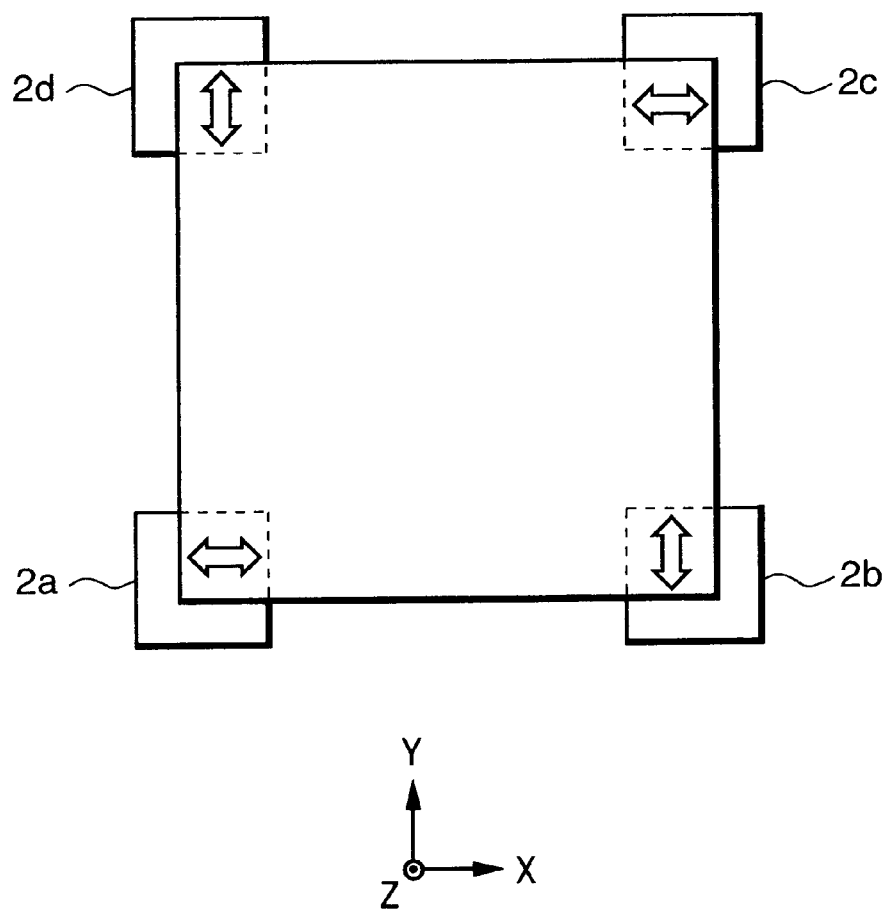
FIG. 12 is a diagram illustrating the disposition of the actuators and the driving-axis directions thereof related to the anti-vibration apparatus shown in FIG. 11.

FIG. 1 shows the configuration of an active anti-vibration apparatus in accordance with a first embodiment of the present invention. In FIG. 1, the components which are common or corresponding to those of the example of the prior art shown in FIG. 11 are given like reference numerals and the description thereof will be omitted. The active anti-vibration apparatus shown in FIG. 1 differs from the one shown in FIG. 11 in that a pressurizing force feedback loop has been added. In the following description, the term "pressurizing force" means the pressure measured as the internal pressure of an air spring or the pressure measured as the load of the air spring.

Figure 2:
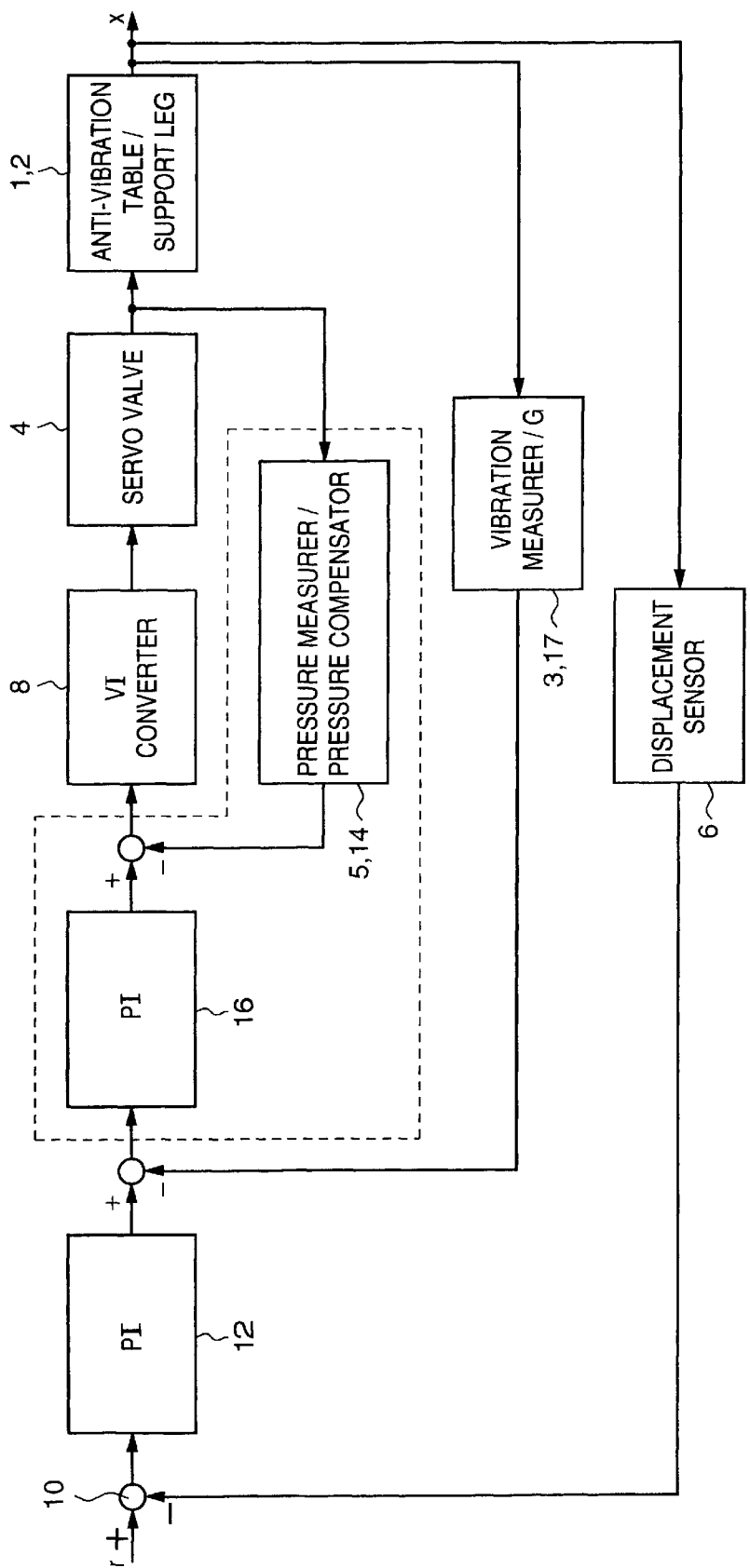
FIG. 2 is a block diagram of a single-axis type active anti-vibration apparatus equipped with a pressure feedback system corresponding to one axis of the apparatus shown in FIG. 1.

For easier understanding, how the foregoing feedback loop is built in a single-axis active anti-vibration apparatus will be explained with reference to FIG. 2. In FIG. 2, the pressurizing force feedback loop, which has been added, is encircled by a dashed line. A description will be given to a case where the internal pressure of an air spring actuator 4 is measured and fed back, i.e., the pressurizing force feedback means pressure feedback.

First, the internal pressure of the air spring actuator (servo valve) 4 is measured by a pressure measurer 5 and negatively fed back to the section before a voltage-current converter 8 via an appropriate pressure compensator 14. Further, the vibration of an anti-vibration table 1 is measured by a vibration measurer 3 and the measurement result is fed back via a gain compensator 17 to provide an operating amount which is supplied to the section preceding a PI compensator 16. This enables the air spring actuator 4 to perform damping. The reason why the PI compensator 16 is necessary and the setting of the parameters thereof will be explained using formulas and FIG. 3 which shows the block diagram of the control scheme shown in FIG. 2.

Figure 3:
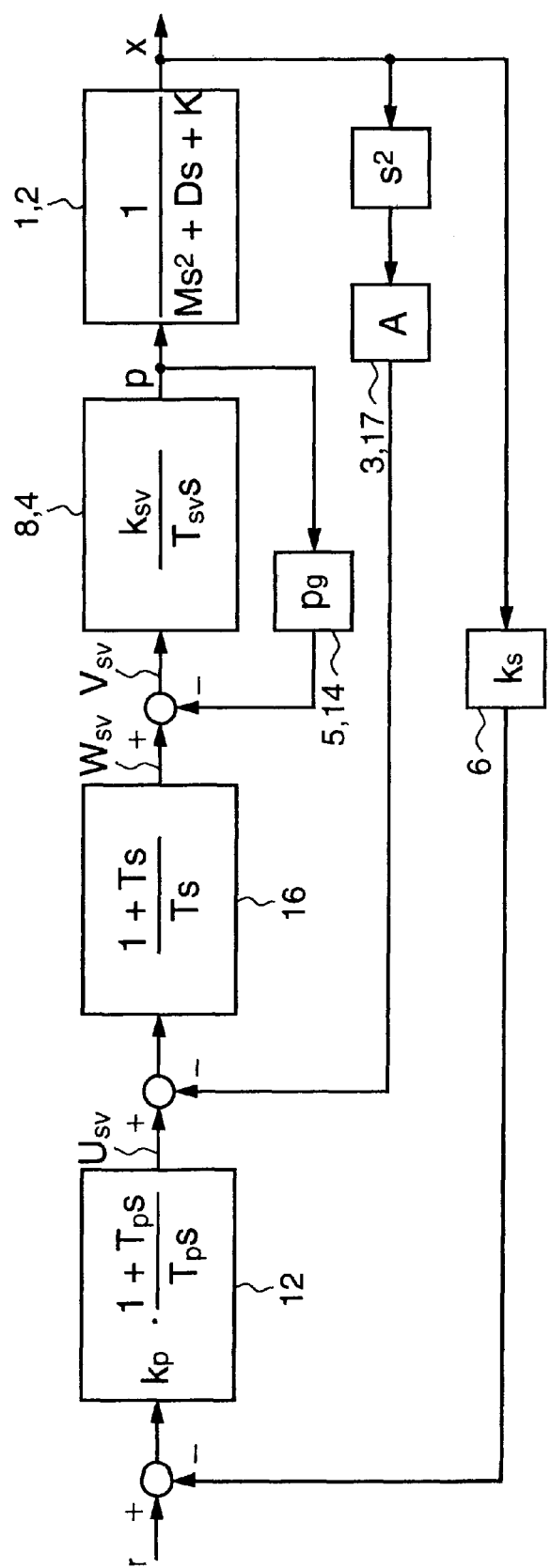
FIG. 3 is a control block diagram of the apparatus shown in FIG. 1.

First, in FIG. 3, the transfer function from an input $v_{sv}$ of the voltage-current converter 8 to an internal pressure p of the air spring actuator 4 is represented by the following formula:

[Formula 1]

$$\frac{p}{v_{sv}} = \frac{k_{sv}}{T_{sv}s} \quad (1)$$

Actually, the transfer function exhibits the first-order lag characteristic which has a break point in an extremely low frequency range; it can be considered to have an almost integration characteristic in a higher frequency range. Then, the internal pressure p is detected and the detected internal pressure p is multiplied by gain $p_g$ of the pressure compensator 14 before it is fed back to the section preceding the voltage-current converter 8.

At this time, the transfer function from a new input $w_{sv}$ of the voltage-current converter 8 to the internal pressure p is expressed by the following formula:

[Formula 2]

$$\frac{p}{w_{sv}} = \frac{1}{p_g} \cdot \frac{1}{1+sT'_{vs}} \quad (2a)$$

where $$T_{SV}' = \frac{T_{sv}}{p_g k_{sv}} \quad (2b)$$

Thus, due to the first-order lag characteristic, the internal pressure p which is nearly constant and which is specified by the input $w_{sv}$ can be obtained.

A case wherein acceleration feedback of gain A is applied to the system expressed by the above formula will now be considered. If the pressure feedback based on formula (2a) is absent, that is, if merely the acceleration feedback of gain A is applied to the section before the voltage-current converter 8, then the formula given below applies:

[Formula 3]

$$\frac{k_{sv}}{T_{sv}s} \cdot \frac{1}{Ms^2 + \{D + (Ak_{sv}/T_{sv})\}s + K} \quad (3)$$

Gain A of the acceleration feedback has a function which imparts damping to the mechanism of the air spring actuator 4. This is attributable to the integration characteristic of the transfer function from $v_{sv}$ to p. If the pressure feedback is applied, then the characteristic from $w_{sv}$ to p turns into the first-order lag characteristic as shown by formula (2a) and the integration characteristic disappears; therefore, even if the acceleration feedback having gain A is applied to the system, it would equivalently act to operate the mass term. As a result, the damping function for stabilizing the mechanism would be lost. To avoid this, as shown in FIG. 3, the PI compensator 16 is inserted before the system to which the pressure feedback has been applied so as to implement the acceleration feedback of gain A on the section before the compensator. It should be noted that T for establishing the zero of the PI compensator 16 is set such that it is equal to $T_{sv}'$; in other words, it is set such that the pole and zero cancel each other. At this time, the transfer function from $u_{sv}$ to x is represented by the following formula:

[Formula 4]

$$\frac{x}{u_{sv}} = \frac{1}{p_g} \cdot \frac{1}{Ts} \cdot \frac{1}{Ms^2 + \{D + (A/P_gT)\}s + K} \quad (4)$$

From the above formula, it can be seen that gain A of the acceleration feedback provides the damping function. The transfer function indicated by reference numeral 12 in FIG. 3 is obviously the PI compensator related to position and related to the compensator used for settlement at the equilibrium position specified by position target voltage r with no steady-state error.

Formulas (2a) and (2b) indicate the transfer functions applied when internal pressure p is detected and fed back to the section preceding the voltage-current converter 8 via gain $p_g$ of the pressure compensator 14. At this time, if the characteristic is expressed completely as formula (1) from $v_{sv}$ to p, then no steady-state error is produced when $w_{sv}$ is received. Actually, however, the first-order lag characteristic is observed as indicated by the following formula as described previously.

[Formula 5]

$$\frac{p}{v_{sv}} = \frac{k_{sv}}{1+T_{sv}s} \quad (5)$$

Figure 4:
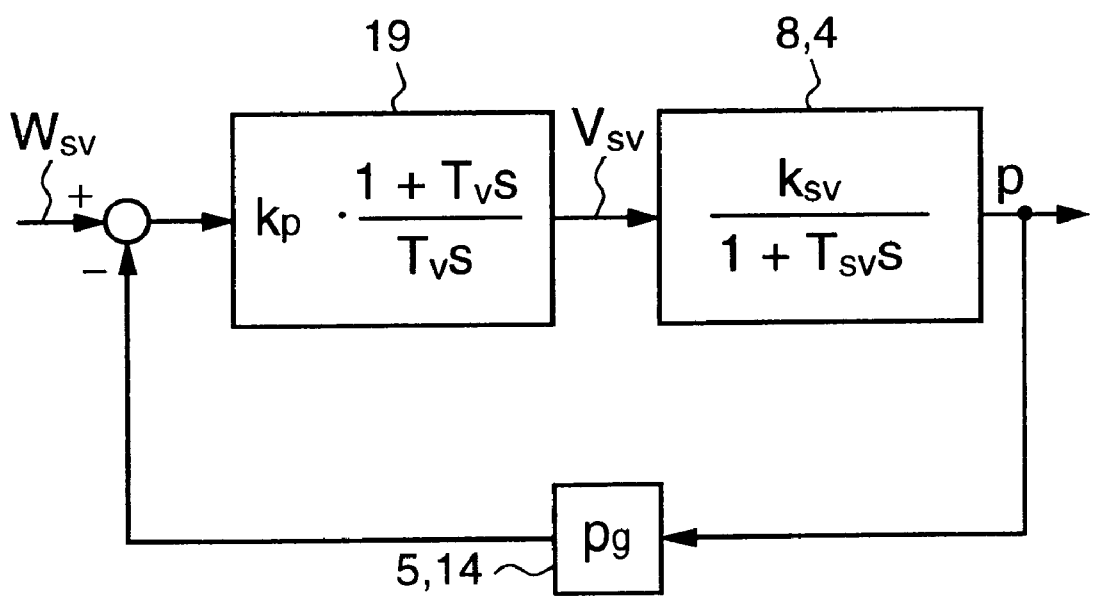
FIG. 4 is a block diagram of a pressure control scheme showing an example of a modification of the apparatus shown in FIG. 1.

Based on the characteristic, the system may be configured as described below. First, in order to prevent the steady-state error from occurring in response to $w_{sv}$, a pressure compensator 19 is inserted at the section preceding $v_{sv}$ by referring to FIG. 4, which is another pressure control block diagram. As the pressure compensator 19, a PI compensator, for example, is used as illustrated. At this time, the transfer function from pressure instruction voltage $w_{sv}$ to actual pressure p is expressed by the following formula:

[Formula 6]

$$\frac{p}{w_{sv}} = \frac{k_p k_{sv}(1+T_v s)}{T_v T_{sv}s^2 + (1 + p_g k_p k_{sv})T_v s + p_g k_p k_{sv}} \quad (6)$$

In this case, a choice is made so that $T_v = T_{sv}$. More specifically, the pole $(-1/T_{sv})$ of the first-order delay having the break point at an extremely low frequency is canceled by the zero $(-1/T_v)$ of the pressure compensator (PI compensator) 19. At this time, the first-order lag characteristic indicated by the formula below is obtained and the characteristic which makes it possible to provide the pressure specified by $w_{sv}$ without steady-state error.

[Formula 7]

$$\frac{p}{w_{sv}} = \frac{1}{p_g} \cdot \frac{1}{1+(1+T_v/p_g k_p k_{sv})s} \quad (7)$$

After configuring the system so as to obtain formula (7), an additional PI compensator 16 is provided as shown in FIG. 2 as previously mentioned.

Based on the above, referring now back to FIG. 1, there are shown in FIG. 1: pressure measurers 5a through 5d which measure the internal pressures of air spring actuators 4a through 4d; pressure compensators 14a through 14d; another input 15 for the pressure compensators 14a through 14d which serves as a pressure target voltage input terminal for setting a predetermined voltage indicating the internal pressure providing the reference for the respective air spring actuators 4a through 4d. Available sensors that can be used for the pressure measurers 5a through 5d include diffusion semiconductor distortion gauges type, metal distortion gauge type, force balance type, differential capacitance type, Bourdon-tube type, and bellows type.

As illustrated, the output signals of the pressure compensators 14a through 14d are negatively fed back to the preceding stage of voltage-current converters 8a through 8d which drive a servo valve (not shown). As explained in conjunction with FIG. 2 or FIG. 3, PI compensators 16a through 16d are additionally inserted at the preceding section to which the outputs of the pressure compensators 14a through 14d have been negatively fed back. As described previously, the characteristic observed from the inputs of the voltage-current converters 8a through 8d of the respective support legs to the internal pressures of the air spring actuators 4a through 4d is turned into the first-order lag by the pressure feedback; hence, the zero of each of the PI compensators 16a through 16d is set so as to cancel the first-order lag pole. Thus, the operating amount obtained by feeding back the output of a motional mode selector 7A, which is related to acceleration, to the section preceding a motional mode distributor 9 via gain compensators $17_x$, $17_y$, and $17_z$ acts purely as a damper. On the other hand, if the PI compensators 16a through 16d serve merely as gain elements, the system on which the pressure feedback has been implemented provides the first-order lag characteristic, so that the operating amount based on the feedback of the output of a motional mode selector 7A related to acceleration via the gain compensators $17_x$, $17_y$, and $17_z$ does not serve as a damper.

Thus, in the first embodiment, the position and the acceleration together constitute the decoupling control scheme to implement a loop which permits the detailed adjustment of the posture control of the anti-vibration table 1 for each motion mode. The pressure feedback system in this embodiment incorporates an independent loop for each air spring actuator so as to control the internal pressure of each of the air spring actuators 4a through 4d of each axis to prevent the structure including the anti-vibration table 1 from being deformed or distorted. At this time, merely applying the pressure feedback would ruin the damping effect given by the acceleration feedback. To avoid this, the additional PI compensators 16a through 16d are provided before the system to which the pressure has been fed back. In this case, the zero is set such that the pole having the first-order lag characteristic resulting from the pressure feedback is canceled.

The performance index of the XY stage 13 on the anti-vibration table 1 is determined by positioning time and positioning accuracy. In this case, an attempt to maximize these performance index factors has revealed that they are greatly dependent on the posture control characteristic of the anti-vibration table. Particularly, the gain adjustment of the "acceleration feedback loop" for feeding the output signals of the motional mode selector 7A associated with acceleration via the gain compensators $17_x$, $17_y$, and $17_z$ significantly influences the positioning time of the XY stage 13. Merely adding the pressure feedback adversely affects the damping effect obtained by the acceleration feedback. This poses a problem in that the anti-vibration table 1 cannot be supported stably in the equilibrium position, or even if it is supported stably, the positioning performance of the XY stage 13 mounted thereon will be deteriorated. For this reason, the presence of the PI compensators 16a through 16d is extremely important.

The internal pressures of the air spring actuators 4a through 4d are determined by the voltage applied to the pressure target voltage input terminal 15. A method for setting the pressure without causing the structure including the anti-vibration table 1 to be deformed or distorted will be described. Static deformation is permissible as long as it stays constant; it is important that the static deformation does not change. With this in mind, for example, the output of a laser interferometer (not shown) for measuring the position of the XY stage 13, the reading on an alignment type scope (not shown), or the output signal of a distortion gauge attached to a major section of the structure including the anti-vibration table 1 is measured, and the voltage applied to the pressure target voltage input terminal 15 is set such that the foregoing output, reading, or output signal does not vary.

[Second Embodiment]

In the first embodiment described above, the air spring actuators 4a through 4d driven by the servo valve (not shown) have nearly the integration characteristic which is turned into the first-order lag system by carrying out the pressure feedback. Hence, the integration characteristic is restored by inserting the PI compensators 16a through 16d which cancel the pole of the first-order lag system at the section before the system to which the pressure feedback has been applied. Further, the negative feedback of the acceleration signals to the section preceding the PI compensators 16a through 16d enables the operating amounts of the compensators to act as a pure damper for the mechanical dynamics.

If, however, the characteristic of the first-order lag scheme obtained by the pressure feedback is still remains as an approximately integration characteristic in the frequency band where damping is needed, then the damping function can be implemented in the frequency band without inserting the PI compensators 16 for canceling the pole of the first-order lag characteristic resulting from the application of the pressure feedback. For instance, the system to which the pressure feedback has been applied exhibits the first-order lag characteristic having a 1-Hz break point frequency; if the principal vibration of the mechanism of the air spring actuators 4a through 4d is in a higher range of 1 decade, i.e., ten times, or more, then the principal vibration of the mechanism can be damped without inserting the additional PI compensator 16. A specific example is a case where the total mass of the anti-vibration table 1 supported by the active support legs 2a through 2d and an object mounted thereon is small.

Figure 5:
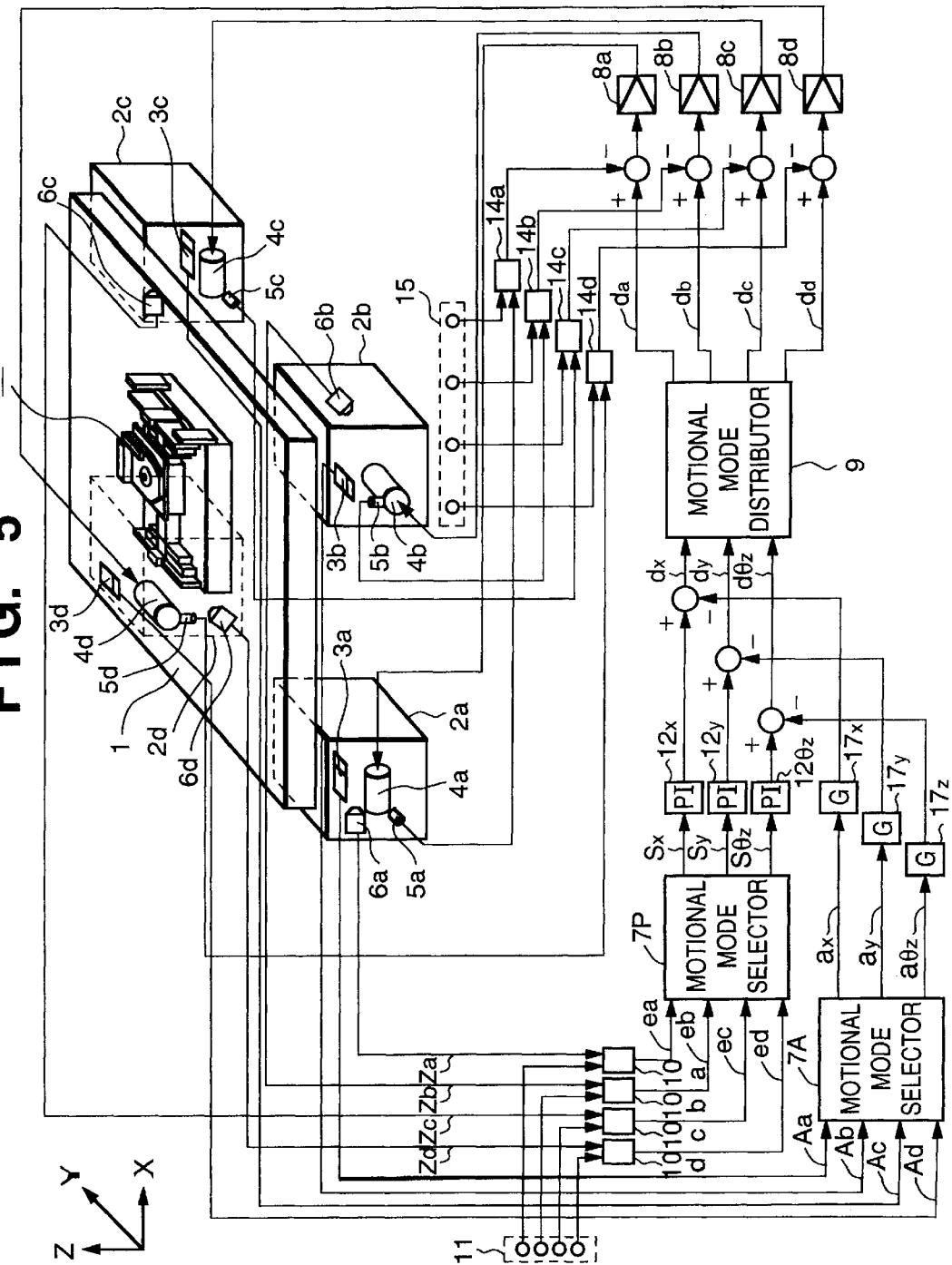
FIG. 5 is a block diagram of an active anti-vibration apparatus according to a second embodiment of the present invention.

Based on the discussion given above, the second embodiment of the present invention will be as shown in FIG. 5. In other words, the active anti-vibration apparatus of the second embodiment has the PI compensators 16a through 16d removed from the one shown in FIG. 1. Strictly speaking, the characteristic observed from the outputs ($d_a$, $d_b$, $d_c$, and $d_d$) of the motional mode selector 9 to the internal pressures of the air spring actuators 4a through 4d is, of course, the first-order lag characteristic; however, if the break point still lies in an extremely low frequency range and the frequency range to which the damping must be implemented by applying the acceleration feedback to the section preceding the motional mode selector 9 is sufficiently higher than the foregoing break point frequency, then it is not indispensable to insert the PI compensators 16a through 16d shown in FIG. 1. More specifically, the pressure feedback acts to maintain the predetermined pressure specified by a received instruction, and the acceleration feedback functions to impart damping to the mechanical resonance peak in the required frequency range, and the position feedback loop acts to achieve settling at the target voltage specified by a position target voltage input terminal 11, with no steady-state error.

[Third Embodiment]

The first and second embodiments described above have been configured such that the skeletons of the compensators for the acceleration and position feedback loops provided in the conventional active anti-vibration apparatus are not changed by the addition of the pressure feedback loop. This makes it possible to inherit the adjustment procedure used for the conventional active anti-vibration apparatus.

In contrast to the first and second embodiments, the third embodiment will show an example where the skeleton of the position feedback loop is changed. The principle of the third embodiment is shown below.

As indicated by formula (1), the characteristic from the input $v_{sv}$ of the voltage-current converter 8 to the internal pressure p of the air spring actuator 4 has been set to the integration characteristic; in practical use, however, it is the first-order lag characteristic having the break point in an extremely low frequency range and it is better expressed by formula (5). The characteristic is expressed again by formula (8), wherein the value of $T_{sv}$ is generally sufficiently large.

[Formula 8]
$$\frac{p}{v_{sv}} = \frac{k_{sv}}{1 + T_{sv}s} \quad (8)$$

If the characteristic from the input $v_{sv}$ of the voltage-current converter 8 to the internal pressure p of the air spring actuator 4 is completely integration characteristic as expressed by formula (1), then the integration characteristic is utilized to implement control such that the damping effect is imparted by the position feedback loop and to achieve zero steady-state position error even if the forward compensators, namely, the PI compensators 12, function to merely provide gain. Actually, however, the characteristic is the one expressed by formula (8); therefore, it has been necessary to install the PI compensators 12 for the forward compensation of the position feedback loop to achieve zero steady-state error related to position.

Based on the fact described above, formula (4) will be referred to again. The integrator in the formula belongs to the additional PI compensator 16 which has been inserted, and the integrator ($1/T_s$) has a perfect integration characteristic rather than an imperfect integration characteristic. In this case, the compensators related to position do not have to be the PI compensators like the one indicated by 12, meaning that simple gain compensation is enough to fulfill the zero steady-state position error.

Figure 6:
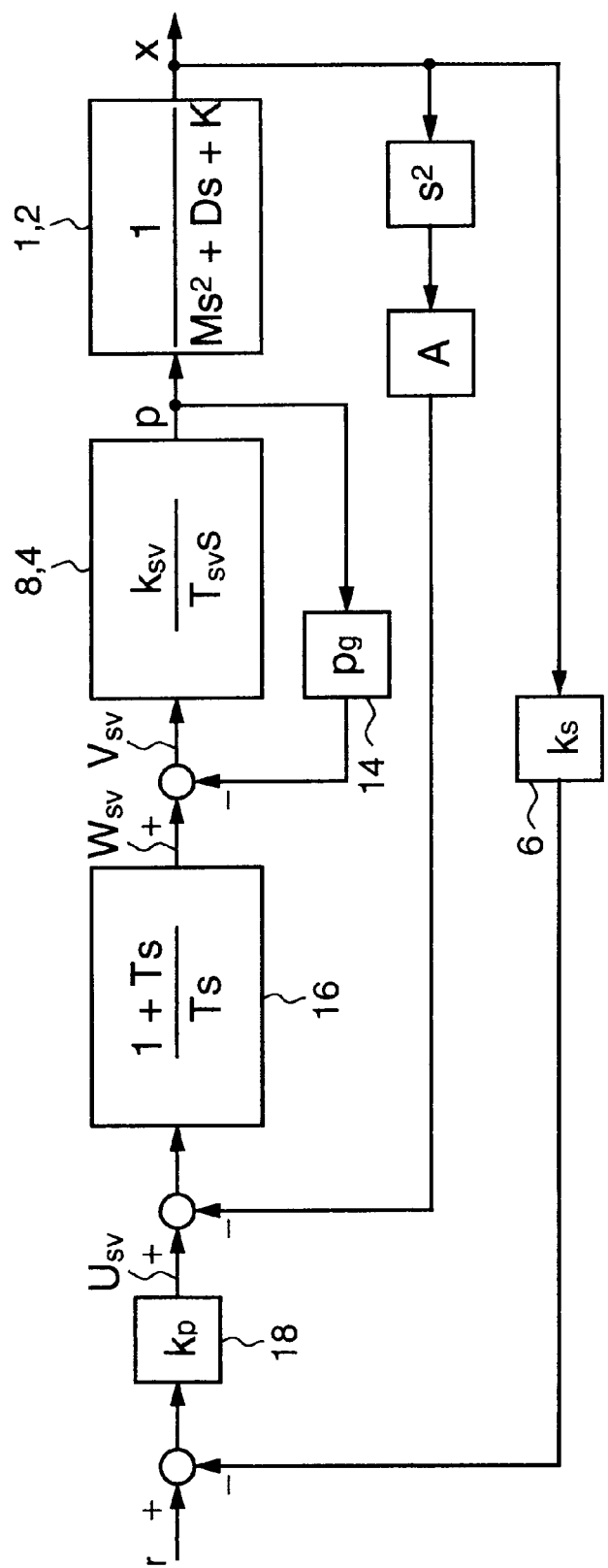
FIG. 6 is a block diagram of a single-axis type active anti-vibration apparatus according to a third embodiment of the present invention.

Taking a single-axis type active anti-vibration apparatus as an example, the third embodiment will be shown in a block diagram of FIG. 6. In FIG. 3, the PI compensator 12 has been employed for the forward compensation of the position feedback loop; it serves as a gain compensator 18 for gain $k_p$ in FIG. 6. It is obvious that developing the third embodiment of the invention into the active anti-vibration can be implemented by replacing the PI compensators $12_x$, $12_y$, and $12\theta z$ by simple gain compensators. This makes it possible to implement the internal pressure of the air spring actuator specified through the pressure target voltage input terminal 15 and also to apply damping to the mechanism by the acceleration feedback loop, thus achieving zero steady-state position error. For the forward compensation of the position feedback loop, the comparison indicates that the gain compensator 18 is superior to the PI compensator 12 in that it enables settling without overshooting.

[Fourth Embodiment]

In the first to third embodiments explained above, the internal pressures of the air spring actuators 4a through 4d are measured by the pressure measurers 5a through 5d. The present invention has been disclosed in the case where the pressurizing force feedback is the pressure feedback. Based on the obvious fact that pressure p multiplied by effective pressure receiving area $S_a$ yields force f, it can be described that, in the first to third embodiments, the force applied to the structure including the anti-vibration table 1, i.e., the load on the air spring actuators, is fed back when the XY stage 13 operates. This means that the distortion of the structure has been prevented by the feedback of pressure p so as to equivalently place force f under control. Hence, more directly, the same advantage as that obtained by the pressure feedback disclosed in the first to third embodiments can be obtained as long as force f stays detectable.

The transfer function from the input $v_{sv}$ of the voltage-current converter 8 to force f generated by the air spring actuator 4 is represented as shown below by using formula (1):

[Formula 9]
$$\frac{f}{v_{sv}} = \frac{S_a k_{sv}}{T_{sv}s} \quad (9)$$

Then, formula (5) is used to obtain the following:

[Formula 10]
$$\frac{f}{v_{sv}} = \frac{S_a k_{sv}}{1 + T_{sv}s} \quad (10)$$

The comparison between formulas (1) and (9) and (5) and (10) indicates that they share the same dynamics although they have different dimensions from each other. It can be seen, therefore, that exactly the same configuration as that for the pressure feedback based on the detection of pressure p may be applied to the feedback based on the detection of force f. This feedback can be called a load feedback, and in combination with the pressure feedback described in the first through third embodiments, it will be referred to a pressurizing force feedback.

The load feedback mentioned above can be implemented by replacing the measurement of internal pressure p by the pressure measurers 5a through 5d by the detection of force f by the load measurers in the pressure feedback of FIG. 1 through FIG. 6. As the load measurer, a load cell composed primarily of a distortion gauge may be used; an example of a mounted load cell is shown in FIG. 7.

Figure 7:
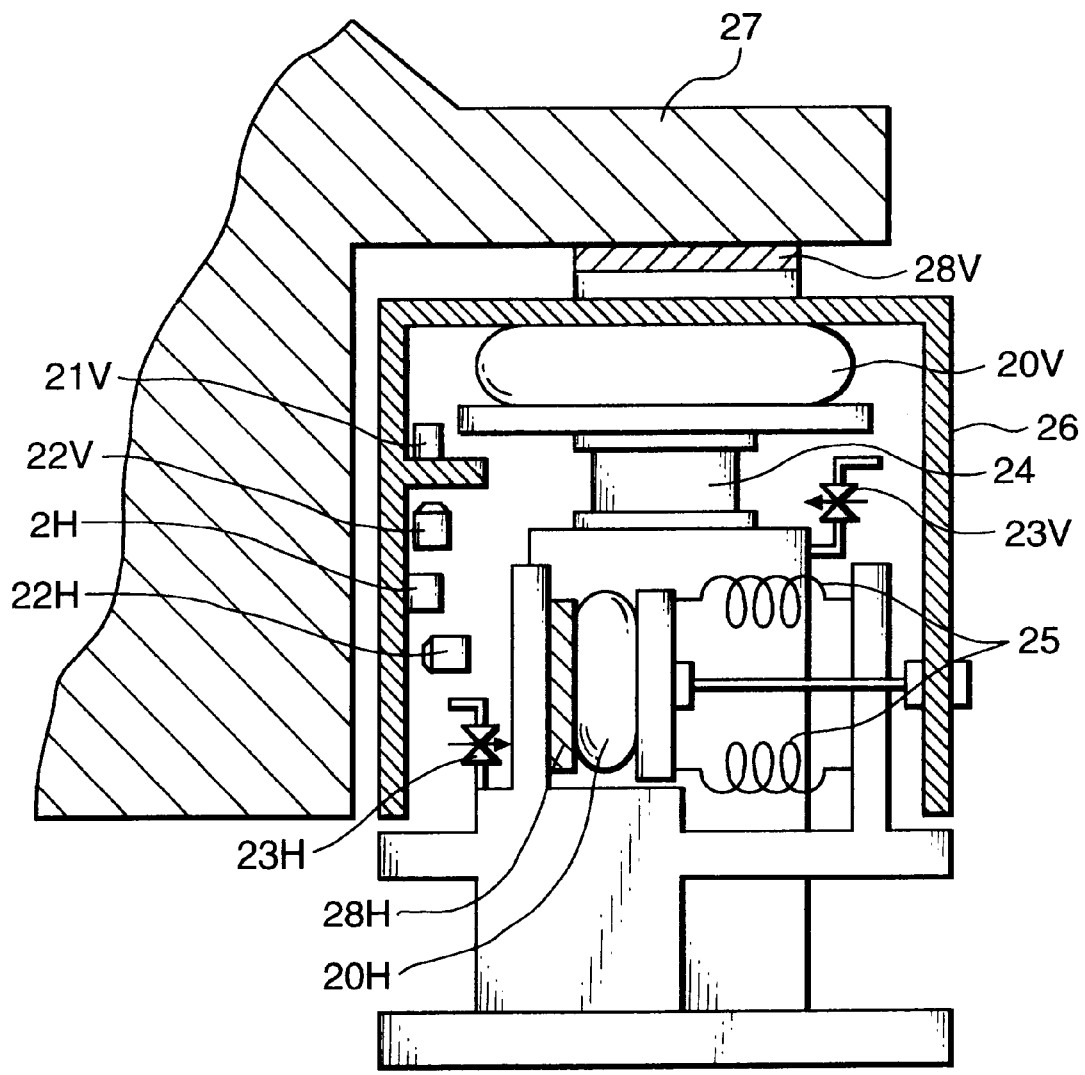
FIG. 7 is a diagram showing an example of an installed load measuring means according to a fourth embodiment of the present invention.

FIG. 7 illustrates an example of the internal structure of the active support legs 2a through 2d. Included in the structure are: an air spring 20V (H) of the perpendicular or horizontal direction; an acceleration sensor 21V (H) serving as the vibration measurer of the perpendicular or horizontal direction; a position sensor 22V (H) serving as the displacement sensor of the perpendicular or horizontal direction; an electric pneumatic analog valve 23V (H) of the perpendicular or horizontal direction (e.g., servo valve, electric pneumatic proportional valve, and electric pneumatic regulator) for controlling the inflow and outflow of the working fluid to and from the air spring 20V (H); a multilayer rubber member 24; a preload spring 25 for the horizontal direction; and a casing 26. The force generated by the air spring 20V of the perpendicular direction is measured by a load sensor 28V inserted between the casing 26 and the structure 27. Likewise, the force generated by the air spring 20H of the horizontal direction is measured by the load sensor 28H.

[Fifth Embodiment]

Figure 8:
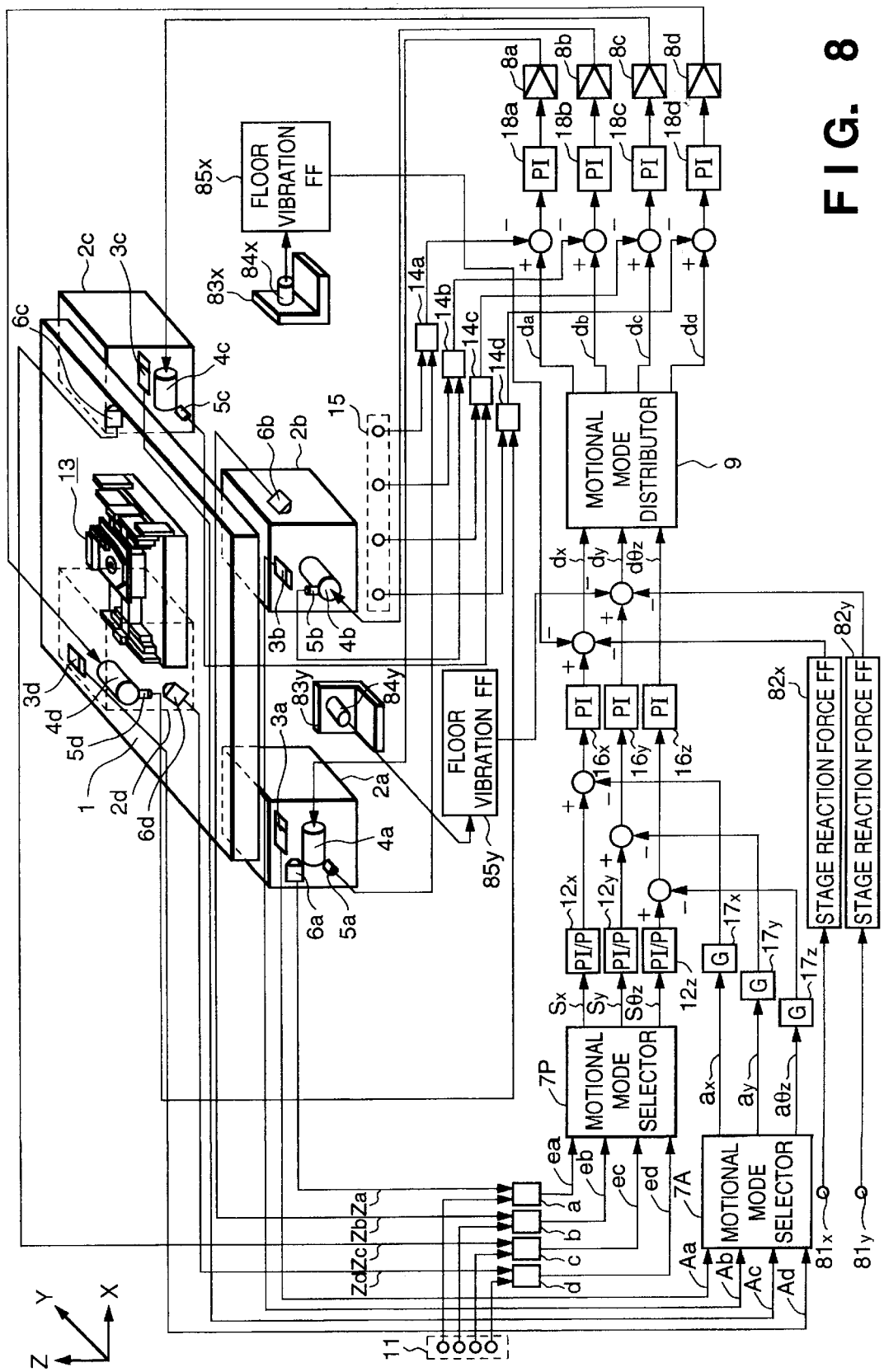
FIG. 8 is a block diagram of an active anti-vibration apparatus according to a fifth embodiment of the present invention.

FIG. 8 shows the configuration of an active anti-vibration apparatus according to a fifth embodiment of the present invention; in the drawing, the components common or corresponding to those of the conventional example shown in FIG. 1 are given like reference numerals. In FIG. 8, reference numerals $82_x$ and $82_y$ denote stage reaction force feedforward compensators, and reference numerals $85_x$ and $85_y$ denote floor vibration feedforward compensators. The outputs of these two types of compensators are given at the section before the motional mode distributor 9. They are added such that they provide inputs to $d_x$ indicative of the X translation when the movement in the X direction is required and to $d_y$ indicative of the Y translation when the movement in the Y direction is required. In this embodiment, it will be shown how to optimally set the two types of compensators when the stage reaction force feedforward compensators and the floor vibration feedforward compensators are added to the active anti-vibration apparatus shown in the first, second, third, or fourth embodiment described above.

Figure 13:
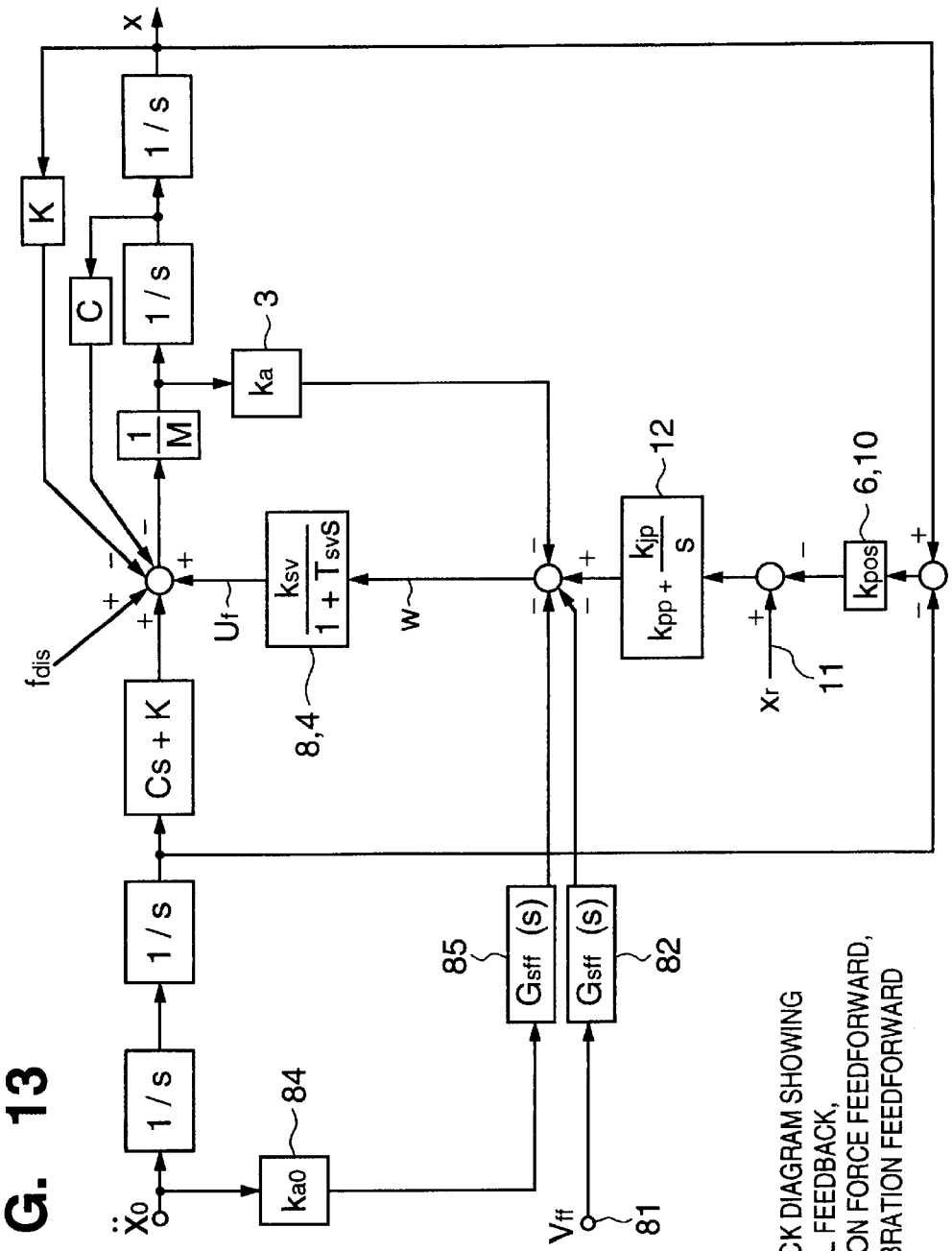
FIG. 13 is a control block diagram showing conventional feedback, stage reaction force feedforward, and floor vibration feedforward.

In order to show the theoretical background, a single-axis active anti-vibration apparatus is taken as an example; it will be described how the compensators for the stage reaction force feedforward and for the floor vibration feedforward have been incorporated. FIG. 13 is the control block diagram of the feedback, the stage reaction force feedforward, and the floor vibration feedforward according to the prior art. The motional equation for the object to be controlled is expressed as shown below.

[Formula 11]

$$M\ddot{x}+C(\dot{x}-\dot{x}_0)+K(x-x_0)=u_f+f_{dis} \quad (11)$$

where M=Mass of anti-vibration table (kg)
C=Viscous damping coefficient [N·s/m]
K=Spring constant [N/m]
$f_{dis}$=Disturbance [N]
x=Displacement of anti-vibration table [m]
$x_0$=Displacement of floor vibration [m]

The dimension of operating amount $u_f$ of the air spring actuator is indicated in [Pa] when the control by the pressurizing force feedback loop is conducted according to the measurements given by the pressure measurer, while it is indicated in [N] when the control by the feedback loop is conducted according to the measurements given by the load measurer. The description will use uf having the dimension of the control block diagram of FIG. 9 rather than that of FIG. 13.

Referring back to FIG. 13, the transfer function from input w of the voltage-current converter 8 to operating amount $u_f$ is represented by the following formula.

[Formula 12]

$$\frac{u_f}{w} = \frac{k_{sv}}{1+T_{sv}s} \quad (12)$$

In general, however, $T_{sv}$ is sufficiently large and formula (12) can be also represented approximately as an integrator as shown below.

[Formula 13]

$$\frac{u_f}{w} = \frac{k_{sv}}{T_{sv}s} \quad (13)$$

First, in the conventional control scheme, damping is imparted by the acceleration feedback loop based on $k_s$ [V·s²/m], and positioning at a specified point is performed by the position feedback loop based on $k_{pos}$ [V/m] and the position compensator (PI compensator) 12. The transfer function of a compensator 85 for the floor vibration feedforward which effectively functions for such a closed loop system has been as shown by the following formula.

[Formula 14]

$$G_{ff}(s) = \frac{T_{sv}(K+Cs)}{k_{a0}k_{sv}s} \quad (14)$$

This indicates the type of PI compensator represented by the following formula.

[Formula 15]

$$G_{ff}(s) = k_{ff} \cdot \frac{1+T_{ff}s}{T_{ff}s} \quad (15)$$

$T_{ff}$ is set so that it is equal to C/K ($T_{ff}$=C/K). For implementing simpler $G_{ff}(s)$, an integrator has been acceptable as shown by the formula given below.

[Formula 16]

$$G_{ff}(s) = k'_{ff} \cdot \frac{1}{s} \quad (16)$$

In this case, viscous damping coefficient C has been ignored while keeping spring constant K.

According to the stage reaction force feedforward art, a signal (not shown) for driving the XY stage 13 is led to a stage drive signal input terminal 81 and fed forward to the section preceding the voltage-current converter 8 via transfer function $G_{sff}(s)$ of a stage reaction force feedforward compensator 82; $G_{sff}(s)$ had to be set according to the formula given below.

[Formula 17]

$$G_{sff}(s) = k_{sff} \cdot \frac{T_{sff}s}{1+T_{sff}s} \quad (17)$$

where $T_{sff}$ denotes a differential time constant [s], $k_{sff}$ denotes stage reaction force feedforward gain [–], and formula (17) takes the form of a "pseudo-differential".

This embodiment has been adapted to implement further optimized floor vibration feedforward and stage reaction force feedforward for the feedback loop for the anti-vibration table 1 of an active anti-vibration apparatus equipped with the foregoing first to fourth pressurizing force feedback loops based on the measurements given by the pressure measurer or the load measurer in addition to acceleration and position. To be more specific, when the pressurizing force feedback loop based on the measurements of pressure or load, the response from the moment the drive instruction voltage is applied to the air spring actuator to the moment the pressure or force corresponding to the applied voltage is generated will be based on the first-order lag scheme. Hence, according to this characteristic, the forms of the transfer functions of the floor vibration feedforward compensator and stage reaction force feedforward compensator are specified uniquely. The forms of both feedforward compensators will be discussed in more detail.

Figure 9:
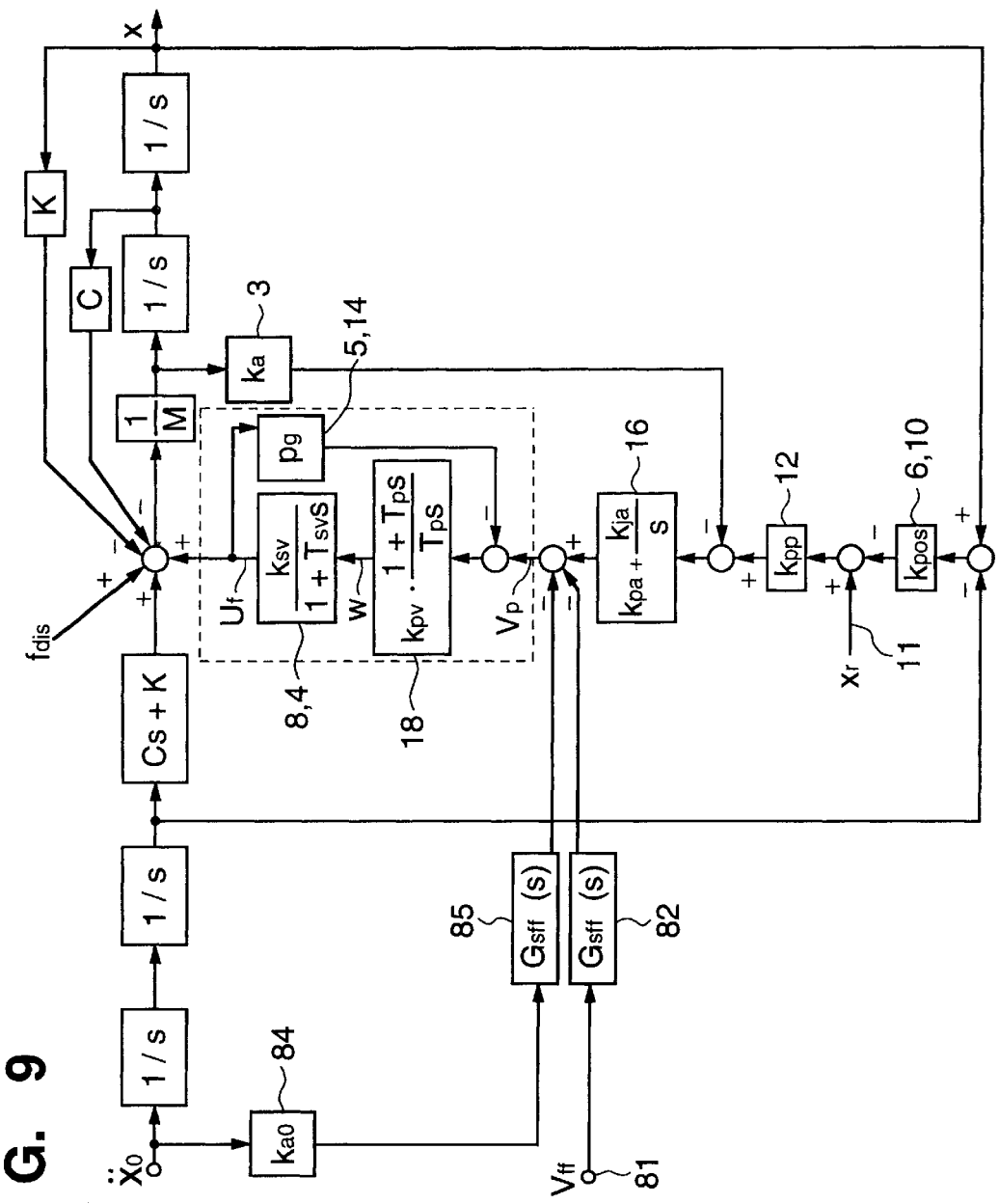
FIG. 9 is a control block diagram of the feedback system corresponding to one axis of the apparatus shown in FIG. 8, stage reaction force feedforward, and floor vibration feedforward.

FIG. 9 shows the control block diagram of the feedback, stage reaction force feedforward, and floor vibration feedforward for one axis of the apparatus shown in FIG. 8. First, the transfer function of the system enclosed by the dashed line shown in FIG. 9, namely, the pressurizing force feedback system, will be discussed. The transfer function from a new instruction voltage $v_p$ to operating amount $u_f$ can be represented by the formula given below, where $T_{pv}=T_{sv}$.

[Formula 18]

$$\frac{u_f}{v_p} = k'_{ff} \frac{k_{pv}k_{sv}}{p_g k_{pv} k_{sv} + T_{pv}s} = \frac{k'_{sv}}{1 + T'_{sv}s} \quad (18a)$$

where $$k'_{sv} = 1/p_g, \quad T'_{sv} = T_{pv}/p_g k_{pv} k_{sv} \quad (18b)$$

This means that the characteristic from $v_p$ to $u_f$ is the first-order lag system. The formulas above apply to a case where the transfer function from w to $u_f$ is set to the first-order lag scheme as expressed by formula (12). In comparison, when the characteristic is regarded as the integrator as shown by formula (13), there is no need to insert the PI compensator 18; the zero steady-state error can be achieved by carrying out feedback based simply on pressure gain $p_g$. In this case, the following formulas will apply.

[Formula 19]

$$\frac{u_f}{v_p} = \frac{k_{sv}/(T_{sv}s)}{1 + (p_g k_{sv} + T_{pv}s)} = \frac{k'_{sv}}{1 + T''_{sv}s} \quad (19a)$$

where $$T''_{sv} = T_{sv}/p_g k'_{sv} \quad (19b)$$

In other words, regardless of whether the characteristic from w to $u_f$ is regarded as the first-order lag system expressed by formula (12) or as the integrator expressed by formula (13), the system on which the pressurizing force feedback has been applied will exhibit the first-order lag system as represented by formula (18a) or (19a) in either case. Hence, transfer function $G_{ff}(s)$ of the floor vibration feedforward compensator 85 must be determined based on the fact that the pressurizing force feedback loop has the characteristic of the first-order lag system; it is expressed by the formula shown below.

[Formula 20]

$$G_{ff}(s) = \frac{(K + Cs)(1 + T'_{sv}s)}{k_{a0}k'_{sv}s^2} \quad (20)$$

Thus, the form in which the PI compensators are connected in a double-stage cascade will be provided as represented by the following formula.

[Formula 21]

$$G_{ff}(s) = K_{ff} \cdot \frac{1 + T_1 s}{T_1 s} \cdot \frac{1 + T_2 s}{T_2 s} \quad (21)$$

where $T_1 = C/K$, $T_2 = T_{sv}'$

Further, when the viscosity term in K+Cs in formula (20) is ignored, the following formula is obtained to implement a simpler floor vibration feedforward compensator.

[Formula 22]

$$G_{ff}(s) = \frac{K(1 + T'_{sv}s)}{k_{a0}k'_{sv}s^2} \quad (22)$$

Thus, useful floor vibration feedforward can be achieved even by the cascade connection of the integrator and the PI compensator as shown by the formula below.

[Formula 23]

$$G_{ff}(s) = K_{ff} \cdot \frac{1}{s} \cdot \frac{1 + T_2 s}{T_2 s} \quad (23)$$

Determining transfer function $G_{sff}(s)$ of the stage reaction force feedforward compensator 82 according to the procedure similar to the one described above yields the following formula.

[Formula 24]

$$G_{sff}(s) = K_{sff} \cdot \frac{1 + T'_{sv}s}{1 + T_{ff3}s} \quad (24)$$

Thus, the transfer function takes the form of a phase lead compensator, and $T_{ff3}$ is appropriately established so as to have a break point in a high-frequency range.

In FIG. 9, reference numeral 16 denotes the PI compensator which takes the form expressed by formula (25). The characteristic enclosed by the dashed line in FIG. 9 is of the first-order lag system, so that the system does not serve as a damper even if the feedback of $k_a$ is applied to the system. Therefore, the integrator is restored by inserting the PI compensator 16 before the first-order lag system, and a signal via $k_a$ is fed back to the section before the PI compensator 16 to implement the damping function.

[Formula 25]

$$k_{pa} + \frac{k_{ia}}{s} \quad (25)$$

Furthermore, the position compensator 12 provides gain $k_{pp}$ in place of the PI compensator accordingly as the PI compensator 16 has the integrator. Since the compensator 16 has the integrator, the zero steady-state error associated position is assured.

Referring back to FIG. 8, there are shown: pressure measurers 5a through 5d which measure the internal pressures of air spring actuators 4a through 4d; pressure compensators 14a through 14d; and another input 15 for the pressure compensators 14a through 14d which serves as a pressure target voltage input terminal for setting a voltage equivalent to the internal pressure providing the reference for the respective air spring actuators 4a through 4d. Available sensors that can be used for the pressure measurers 5a through 5d include diffusion semiconductor distortion gauge type, metal distortion gauge type, force balance type, differential capacitance type, Bourdon-tube type, and bellows type. The pressure measurers 5a through 5d may be replaced by the load measurer for measuring the drive forces generated by the air spring actuators 4a through 4d to provide the foregoing feedback loop. A description will now be given of a case where the pressure feedback in the pressurizing force feedback is performed.

As illustrated, the signals issued by the pressure compensators 14a through 14d are negatively fed back to the section before the voltage-current converters 8a through 8d which drive a servo valve (not shown). Then, as described with reference to FIG. 9, additional PI compensators 16 (16$_x$, 16$_y$, and 16$_z$) are inserted at the section preceding the stage where the outputs of the pressure compensators 14 (14$_a$ through $14_d$) have been negatively fed back. In this case, the additional PI compensators are inserted at the section before the motional mode distributor 9 and also before the adding point of the outputs of the stage reaction force feedforward compensators $82_x$, $82_y$ and the floor vibration feedforward compensators $85_x$, $85_y$.

As already explained, the pressurizing force feedback causes the characteristic from drive instructions $d_a$, $d_b$, $d_c$, and $d_d$, which are sent to the respective axes, to the internal pressures of the air spring actuators $4a$ through $4d$ to be the first-order lag system. In the configuration shown in FIG. 8, the first-order lag characteristic is observed from the drive signals $d_x$, $d_y$, and $d\theta z$ for the respective motional modes to the internal pressures of the air spring actuators $4a$ through $4d$ of the respective axes. Hence, the zero of each of the PI compensators $16_x$, $16_y$, and $16_z$ is set so as to cancel the poles of the first-order lag. This enables the operating amount, which is obtained by feeding the output of the motional mode selector 7A related to acceleration to the section preceding the motional mode distributor 9 via the gain compensators $17_x$, $17_y$, and $17_z$, to provide a pure damping function. If the PI compensators $16_x$, $16_y$, and $16_z$ are mere gain factors, then the system to which the pressurizing force feedback has been applied exhibits the first-order lag characteristic, and the operating amount, which is obtained by feeding the output of the motional mode selector 7A related to acceleration via the gain compensators $17_x$, $17_y$, and $17_z$, does not function as a pure damper. It is obvious that, if the first-order lag system resulting from the pressurizing force feedback applied to the frequency zone to which damping is to be imparted has a sufficiently low break-point frequency, then there is no absolute necessity to use PI compensators for $16_x$, $16_y$, and $16_z$; they may alternatively be simple gain compensators.

In the motional-mode decoupling feedback apparatus described above, the stage reaction force feedforward compensators $82_x$ and $82_y$ are added to the section preceding the motional mode distributor 9. The signal (not shown) when the XY stage 13 is driven in the X-axis direction is led to a stage drive signal input terminal $81_x$; likewise, the signal when the XY stage 13 is driven in the Y-axis direction is led to a stage drive signal input terminal $81_y$. In this case, the transfer functions of the stage reaction force feedforward compensators $82_x$ and $82_y$ take the form of the phase lead compensators; the zero is set such that it cancels the lag constant as the first-order lag system of the transfer function of the pressurizing force feedback system. The poles of the phase lead compensator are properly determined so that they have break points in a high-frequency range.

According to the floor vibration feedforward, the vibration of the floor is detected by floor vibration detecting sections $84_x$ and $84_y$ held by $83_x$ and $83_y$, and the detected signal is applied to the section, which is located before the motional mode distributor 9 and to which motional mode drive signals $d_x$ and $d_y$ in the X and Y directions, respectively, are applied via floor vibration feedforward compensators $85_x$ and $85_y$; in other words, the detected signal is applied to the section preceding the pressurizing force feedback loop.

The zero steady-state error associated with position is assured even if the PI compensators $12_x$, $12_y$, and $12\theta z$ serving as the position compensators inserted at the section following the motional mode selector 7P are replaced by simple gain compensators. This is because the PI compensators $16_x$, $16_y$, and $16_z$ have integrators, as previously explained.

In FIG. 8, the pressurizing force feedback loop is built in independently for each axis in the conventional decoupling feedback apparatus for each motional mode. The introduction of the feedback loop provides the PI compensators 16 ($16_x$, $16_y$, and $16_z$); since the compensators have integrators, it has become possible to replace the positional compensators 12 ($12_x$, $12_y$, and $12\theta z$) by gain compensators. Based on such a control configuration, an example is shown of a section which adds the output of the stage reaction force feedforward compensator 82 ($82_x$ and $82_y$) and the output of the floor vibration feedforward compensator 85 ($85_x$ and $85_y$). There are many conceivable modifications of the control configuration which include the decoupling feedback apparatus and the pressurizing force feedback loop built therein. Accordingly, there are several different forms for adding the outputs of the foregoing two types of feedforward compensators. The essence of the embodiment will be explained again in conjunction with FIG. 10, which is illustrative of a simpler control configuration.

Figure 10:
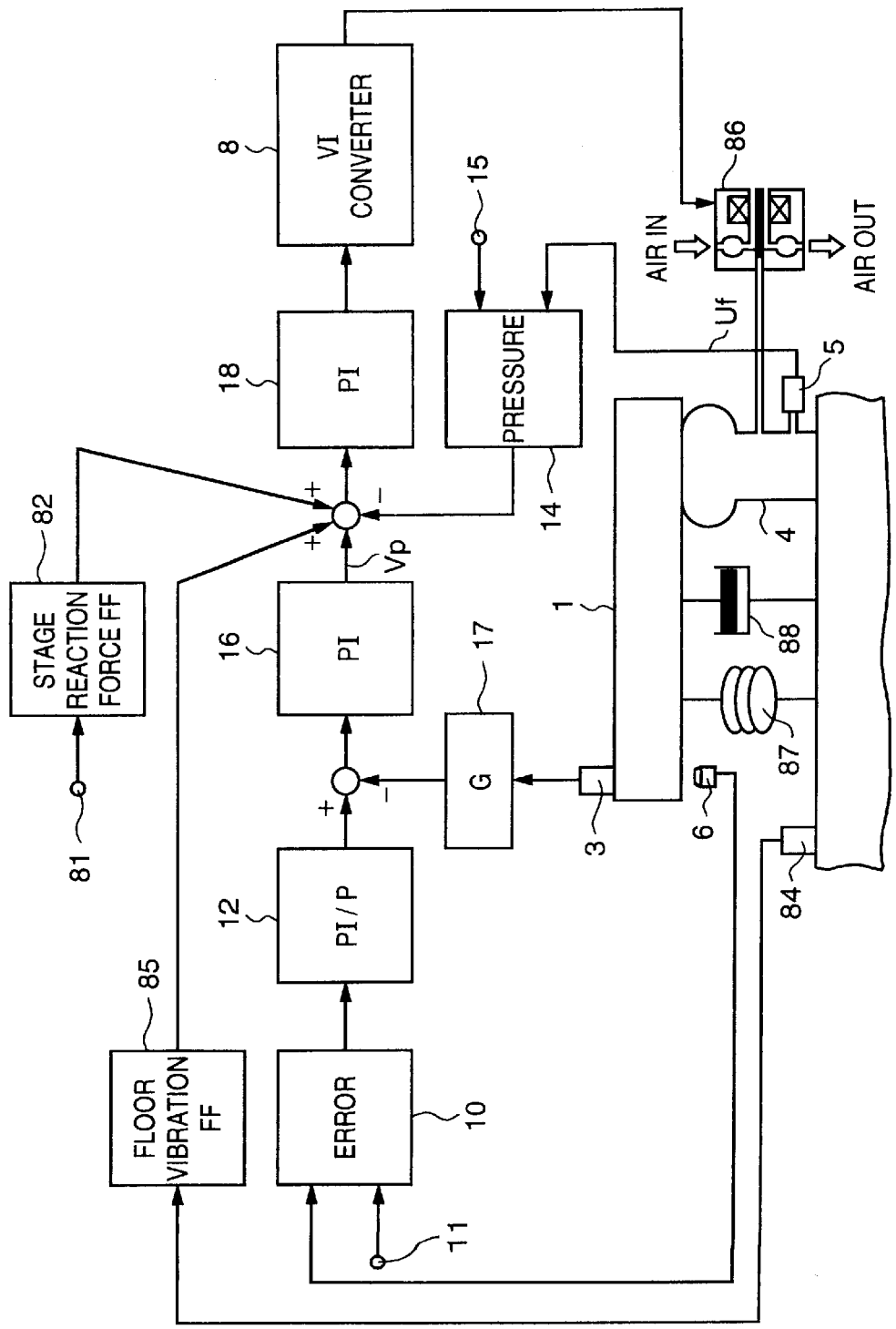
FIG. 10 is a block diagram of a single-axis type active anti-vibration apparatus equipped with a pressure feedback system corresponding to one axis of the apparatus shown in FIG. 8.

Shown in FIG. 10 are an air spring actuator 4, a servo valve 86 (which is included in the air spring actuator 4 in FIG. 8), a mechanical spring 25, and a viscosity element 26. In FIG. 10, the internal pressure of the air spring actuator 4 is measured by a pressure measurer 5, and the output is fed back to the section preceding the PI compensator 18, which is located before the voltage-current converter 8 for driving the servo valve 86, via a pressure compensator or gain compensator 14, thus constituting the pressurizing force feedback loop. The vibration of the anti-vibration table 1 is detected by the vibration measurer 3 and fed back to the section preceding the PI compensator 16 via the gain compensator 17. Considering that the first-order lag characteristic is observed from $v_p$ to $u_f$, the zero of the PI compensator 16 is set to cancel the lag constant. The displacement of the anti-vibration table 1 is detected by the displacement sensor 6 and led to the PI or P compensator 12, serving as the position compensator, via an error amplifier 10. The signal obtained by compensating for the output of the floor vibration detecting section 22 through the floor vibration feedforward compensator 85 is applied to the pressurizing force feedback loop. Likewise, the signal applied to the stage drive signal input terminal 81 is compensated for through the stage reaction force feedforward compensator 82 and applied to the pressurizing force feedback loop.

As explained above, the embodiment provides the advantages shown below.

(1) The optimum stage reaction force feedforward and floor vibration feedforward have been achieved, taking the specific situation into account that the pressurizing force feedback loop based on the pressure or load measurement has been introduced into a conventional active anti-vibration apparatus which has the stage reaction feedforward and the floor vibration feedforward.

(2) Thus, when the XY stage 13 performs step-and-repeat or step-and-scan, the structure can be protected from being subjected to an unnecessary or unbalanced force. This means that the swing or vibration of the anti-vibration table 1 caused by driving the XY stage 13 or other mounted equipment can be effectively restrained, while at the same time, the advantage of the pressurizing force feedback loop for preventing the structure from being deformed can be obtained. As a result, the time required for the positioning and settling of the stage can be shortened. In addition, the propagation of the vibration of the floor to the anti-vibration table 1 can be restrained, so that the positioning accuracy of the equipment such as the XY stage 13 mounted on the anti-vibration table 1 can be improved.

(3) As a result, the productivity can be greatly improved.

<Application Scope of the Present Invention>

For the above embodiments, a specific description has been given to the elimination and control of the vibration in the horizontal direction in the structure designed to support the anti-vibration table by four active support legs, with reference to FIG. 1, FIG. 5, and FIG. 8. It is obvious that the present invention can be well applied to an anti-vibration apparatus in the perpendicular direction, and that there is no restriction on the number of the active support legs used. The control unit employs the analog circuitry in the referred drawings; however, the present invention also covers a case wherein a part or all of the control unit is replaced by a digital arithmetic unit. Furthermore, in the foregoing embodiments, only the air spring actuators are the actuators generating the thrust; however, the present invention may also be applied to a hybrid active anti-vibration apparatus combining an air spring actuator with a linear motor or a voice coil motor, which is a typical electromagnetic motor, or a piezo element or electrostrictive element, which is a typical displacement generating type actuator.

As explained above, the first through fifth embodiments provide the following advantages.

(1) The internal pressures of the air springs for supporting the structure including the anti-vibration table, or the force to be applied by the air springs are set according to a control range, thus making it possible to maintain the specified pressure or force against the disturbance applied to the structure.

(2) Hence, when the XY stage performs the step-and-repeat motion or the step-and-scan motion, the structure will be protected against an unnecessary or unbalanced force, so that it will not be deformed.

(3) Since the deformation of the structure is prevented, the measurement of the measuring instrument mounted thereon is not disturbed.

(4) Since good positioning accuracy can be maintained, good exposure of semiconductor wafers will be ensured with resultant higher productivity.

[Sixth Embodiment]

Figure 14:
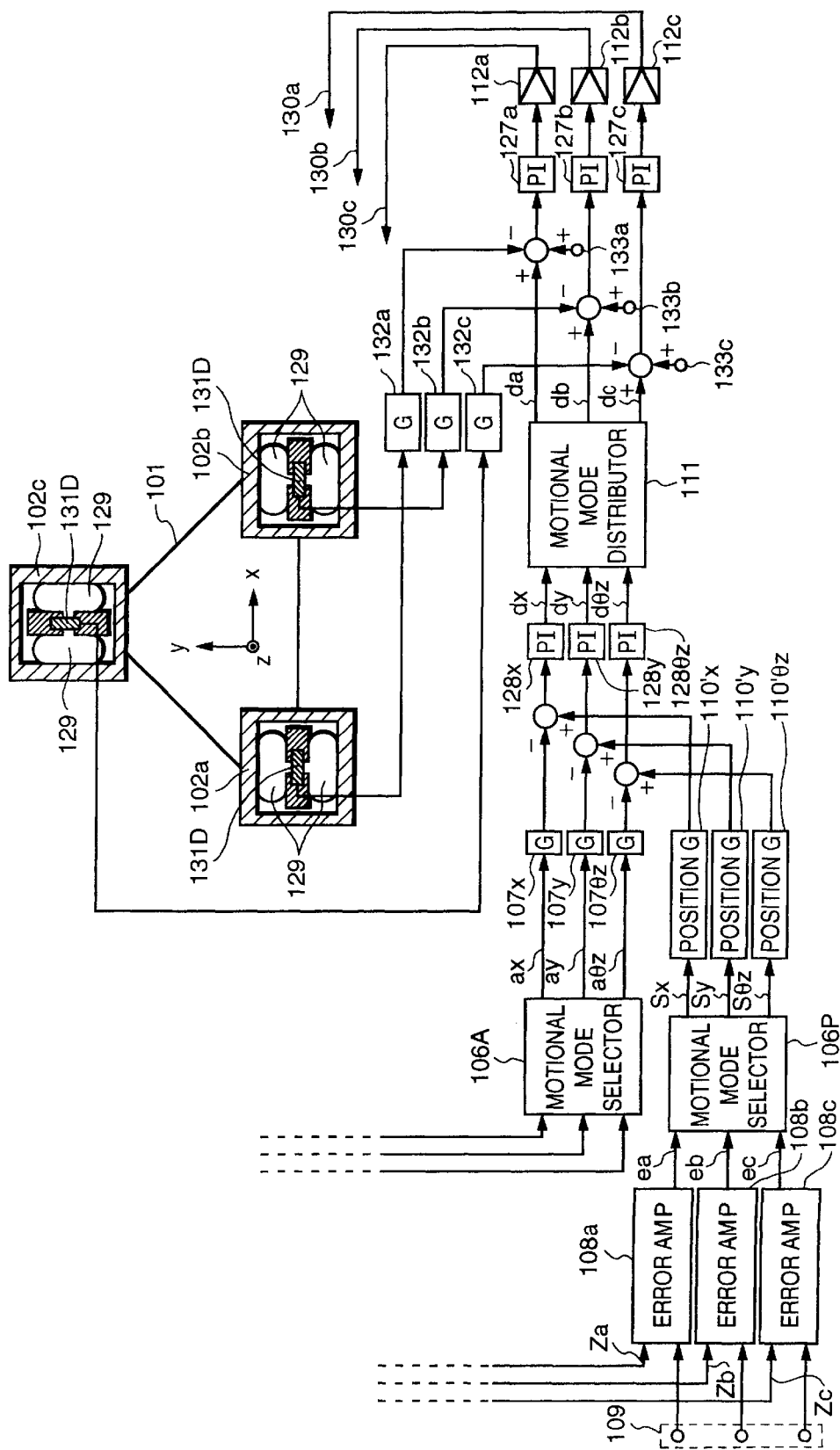
FIG. 14 is a block diagram of an active anti-vibration apparatus according to a sixth embodiment of the present invention.

FIG. 14 shows the configuration of an air spring type active anti-vibration apparatus according to a sixth embodiment of the present invention. Before describing the details of FIG. 14, the control configuration of the active anti-vibration apparatus equipped with the pressurizing force feedback, which corresponds to the control block of FIG. 4, which has been explained based on the control block of FIG. 3 in the first embodiment, will be explained in conjunction with the accompanying drawings, although the description may partly be repetitious.

Figure 18:
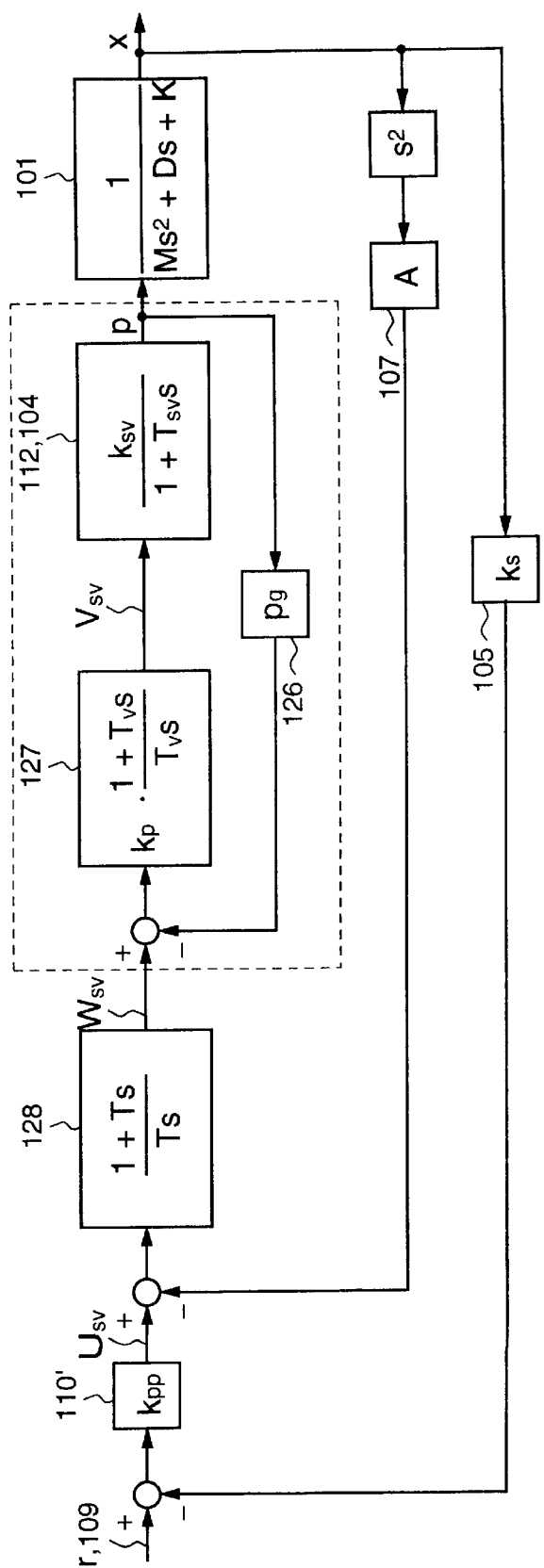
FIG. 18 is a control block diagram of the active anti-vibration apparatus with the pressure feedback system in the first embodiment in accordance with the present invention.

The pressurizing force feedback includes the pressure feedback based on pressure measurement and load feedback based on load measurement. Referring to FIG. 18, the description will be given about the pressure feedback based on pressure measurement and about how the feedback loop is incorporated in an active anti-vibration apparatus. For the purpose of easier understanding, a single-axis type active anti-vibration apparatus will be employed. FIG. 18 shows a control block of the active anti-vibration apparatus equipped with the pressure feedback. In FIG. 18, the section enclosed with the dashed line indicates the pressure feedback loop.

First, the internal pressure of an air spring actuator 104 is measured by a pressure measurer which will be discussed later, and the measured pressure value is compensated for by an appropriate pressure gain compensator 126 before it is negatively fed back to the section preceding a PI compensator 127 associated with pressure. Further, a PI compensator 128 related to acceleration is inserted forward such that the operating amount obtained by feeding back the measurement value of the vibration of an anti-vibration table 101, which measurement value is given by a vibration measurer, via a gain compensator 107 functions as a damper for an air spring actuator 104. A more detailed description will be given in conjunction with formulas. In FIG. 18, the transfer function applied from input $v_{sv}$ supplied to a voltage-current converter 112 to internal pressure p of the air spring actuator 104 is expressed by the following formula.

[Formula 26]

$$\frac{p}{v_{sv}} = \frac{k_{sv}}{1 + T_{sv}s} \tag{26}$$

In this case, however, the function may be regarded nearly as an integrator because the value of $T_{sv}$ is sufficiently large. The transfer function from the moment a new input $w_{sv}$ is supplied to the input terminal of the PI compensator 127 to the moment the corresponding pressure p is actually obtained is given by the following formula.

[Formula 27]

$$\frac{p}{w_{sv}} = \frac{k_p k_{sv}(1 + T_v s)}{T_v T_{sv} s^2 + (1 + p_g k_p k_{sv})T_v s + p_g k_p k_{sv}} \tag{27}$$

In this case, $T_v$ is set so that it is equal to $T_{sv}$ ($T_v = T_{sv}$). In other words, the pole $-1/T_{sv}$ of the first-order lag having the break point at an extremely low frequency is canceled by the zero point $-1/T_v$ of the PI compensator 127 related to the pressure. Thus, the first-order lag characteristic is obtained as shown by the formula given below, so that the pressure specified by $w_{sv}$ may be obtained without steady-state error.

[Formula 28]

$$\frac{p}{w_{sv}} = \frac{1}{p_g} \cdot \frac{k_p k_{sv}(1 + T_v s)}{1 + (T_v / p_g k_p k_{sv})s} \tag{28}$$

Merely applying the acceleration feedback of the gain 104 to formula 28 exhibiting the first-order lag characteristic does not provide the damping function; hence, a PI compensator 128 associated with acceleration is inserted at the section before $w_{sv}$. At this time, the transfer function for $u_{sv}$ to x is represented by the following formula.

[Formula 29a]

$$\frac{x}{u_{sv}} = \frac{1}{p_g} \cdot \frac{1}{Ts} \cdot \frac{1}{Ms^2 + \{D + (A/p_g T)\}s + K} \tag{29a}$$

where T is set as follows:

[Formula 29b]

$$T = \frac{T_v}{p_g k_p k_{sv}} \tag{29b}$$

As it is obvious from formula 29a, gain A functions as a damper. It should be noted that the formula includes the integrator resulting from the addition of the PI compensator 128. In the positional feedback loop, therefore, the error signal indicative of the difference between the target voltage r applied to a position target voltage input terminal 109 and the output of a displacement sensor 105 is obtained by generating $u_{sy}$ through a positional gain compensator 110' which corresponds to the PI compensator 110 in FIG. 15 and which has a simple gain $k_{pp}$.

The above has explained the configuration of the acceleration feedback and positional feedback loop wherein the pressure feedback, which is one type of the pressurizing force feedback, has been added. As described in the first embodiment, in the case of the load feedback, the load may be measured by a load sensor or the like instead of measuring pressure p; the configuration of each feedback loop will be the same as that of the feedback loop equipped with the pressure feedback. There are several possible modifications of the configuration shown in FIG. 18. For instance, if the break-point frequency of the pressure feedback loop enclosed by the dashed line is low and the integration characteristic is observed in the frequency zone where damping is required to be applied to the system, then the PI compensator 128 related to acceleration is rendered to act as a damper even when it is a gain element. To enable positioning at a target point without steady-state error, it is necessary to provide the PI compensator at the location of the positional gain compensator 110' as in the prior art.

As previously discussed, with reference to FIG. 18, the control configuration which includes the pressurizing force feedback loop for a case where one air spring actuator is provided for one operating direction in an active support leg has been described. If the air spring type active anti-vibration apparatus is equipped with a plurality of active support legs, each active support leg having a pair of opposed air spring actuators, to enhance the anti-vibration performance and the vibration control performance, then it is required to constitute a pressurizing force feedback scheme which makes use of the opposed air spring actuators.

The following will describe an embodiment adapted to make use of the opposed air spring actuators.

A control unit with the pressurizing force feedback function for the apparatus equipped with the paired air spring actuators will now be described.

Figure 19:
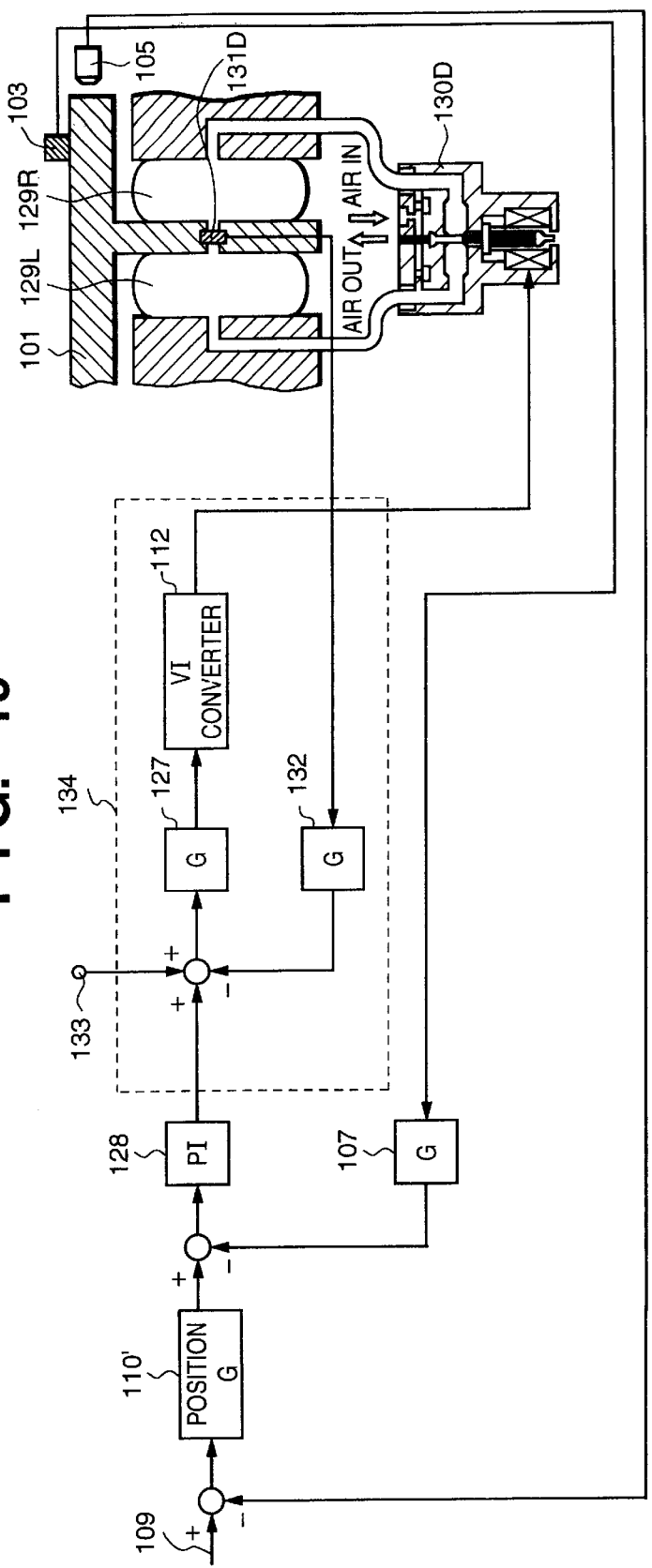
FIG. 19 is a diagram showing the configuration of the control unit when a four-way type servo valve and a differential pressure gauge are employed as the sixth embodiment of the present invention.

FIG. 19 is a block diagram illustrative of the control system wherein the differential pressure between a pair of air springs 129R and 129L is detected by a differential pressure gauge 131D to provide the pressure feedback. In FIG. 19, reference numerals 129R and 129L, respectively, indicate paired right and left air springs, reference numeral 130D indicates a four-way servo valve, and reference numeral 131D indicates a differential pressure gauge serving as a pressure measuring means. The output of the differential pressure gauge 131D is appropriately amplified through a gain compensator 132, and the amplified output signal is negatively fed back to the input terminal of a pressure-related PI compensator 127 provided at the section before a voltage-current converter 112, thus constituting a pressure feedback loop 134 indicated by the dashed line in FIG. 19. The input terminal of the PI compensator 127 is provided with a differential pressure target input terminal 133.

The operation of the four-way servo valve 130D will now be described. In this valve, the neutral pressure of the air springs 129R and 129L is determined by the air flow rate supplied to the valve and the mechanical dimensions thereof. Hence, when no current is being supplied to the voltage-current converter 112, the same amount of air is supplied to the right and left air springs 129R and 129L and the internal pressures thereof also become approximately the same. If, for example, the voltage-current converter supplies air to the air spring 129R and the supplied air causes a rise in the internal pressure of this air spring, then the air supplied to the air spring 129L will be restricted so that the internal pressure thereof will be decreased. For this reason, the four-way servo valve is ideally used for driving the air spring actuators disposed in the push-pull fashion. The voltage applied to the differential pressure target input terminal 133 functions to provide the right and left air springs 129R and 129L with a pressure difference. The rest of the configuration of the system is identical to the one shown in FIG. 15. More specifically, the vibration of the anti-vibration table 101 is detected by a vibration measurer 103 typically represented by an acceleration sensor and the output is negatively fed back to the section preceding the acceleration-related PI compensator 128 via the gain compensator 107. The output of the displacement sensor 105 is compared with the voltage applied to the target voltage input terminal 109 to provide the error signal which is supplied to the position gain compensator 110'. The output signal of the position gain compensator 110' and the negative feedback signal of the gain compensator 107 previously mentioned are added to drive the pressure feedback loop 134 via the PI compensator 128.

Referring back to FIG. 14 which shows the active support legs 102a through 102c disposed at the respective apexes of the approximately triangular anti-vibration table 1, the active support legs are operated to control two differential translational motions in the horizontal direction and one rotational motion.

In FIG. 14, each of the active support legs 102a through 102c is equipped with a pair of opposed air springs in the direction of the driving axis as illustrated in FIG. 19. It is assumed that the active support legs 102a through 102c are further equipped with differential pressure gauges 131D for detecting the pressure difference between the paired air springs and four-way servo valves, which are not shown, but are indicated by reference numerals 130a through 130c as in the case of the active support legs shown in FIG. 19.

The outputs of the differential pressure gauges 131D of the active support legs 102a through 102c are negatively fed back to the input terminals of the pressure-related PI compensators 127a through 127c provided at the section before the voltage-current converters 112a through 112c which supply current to the four-way servo valves 130a through 130c (not shown) via gain compensators 132a through 132c. At the section before the voltage-current converters, there are also provided differential pressure target input terminals 133a through 133c for specifying the differential pressure of each pair of air springs in each of the active support legs 102a through 102c; the specified differential pressure determines the initial posture of the anti-vibration table 101. The pressure feedback is provided independently for each of the active support legs 102a through 102c. Based on the pressure feedback system, the acceleration feedback and the position feedback are constructed and they make up the motional-mode-based decoupling control system.

Figure 15:
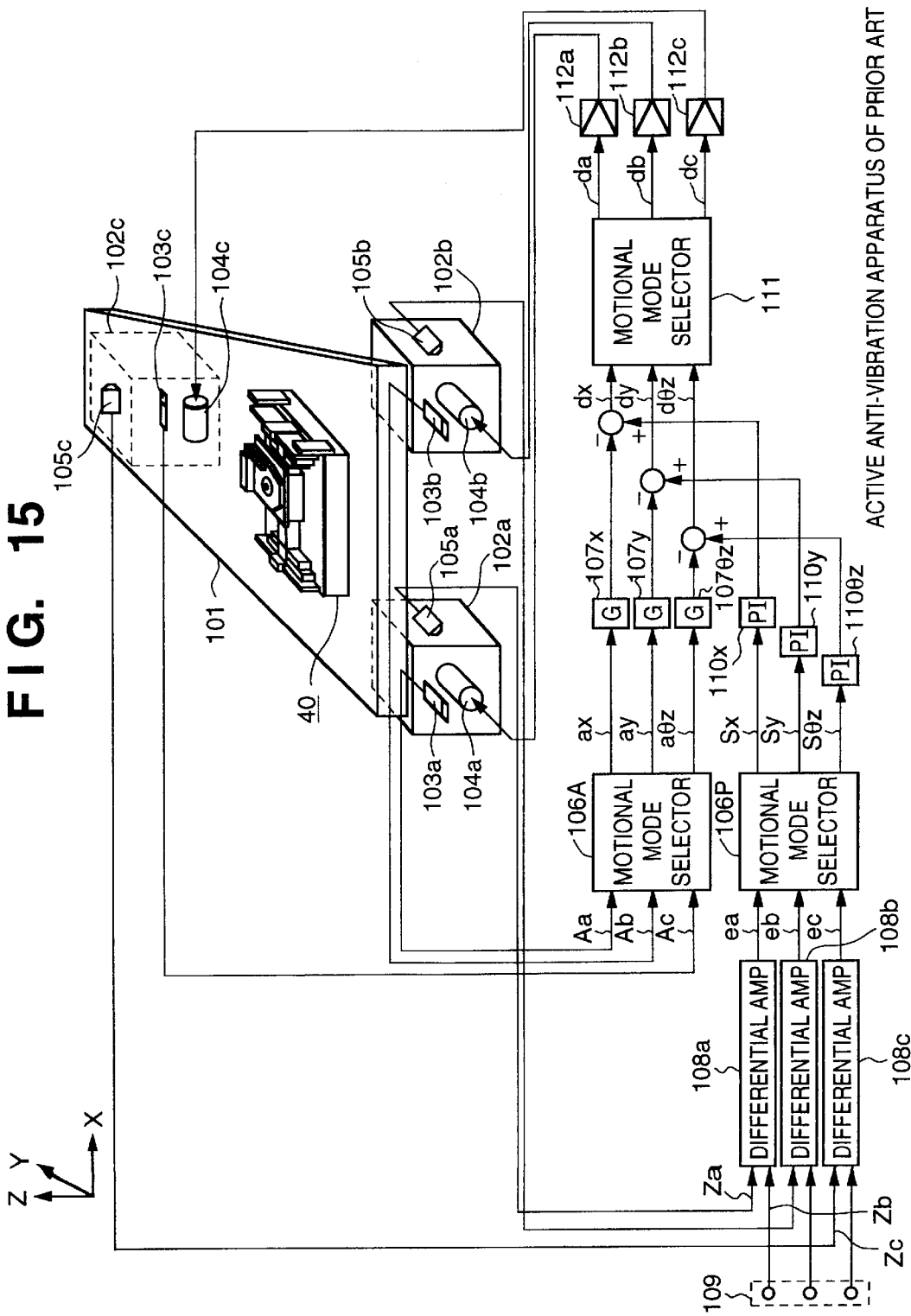
FIG. 15 is a diagram showing the configuration of a conventional active anti-vibration apparatus.
Figure 16:
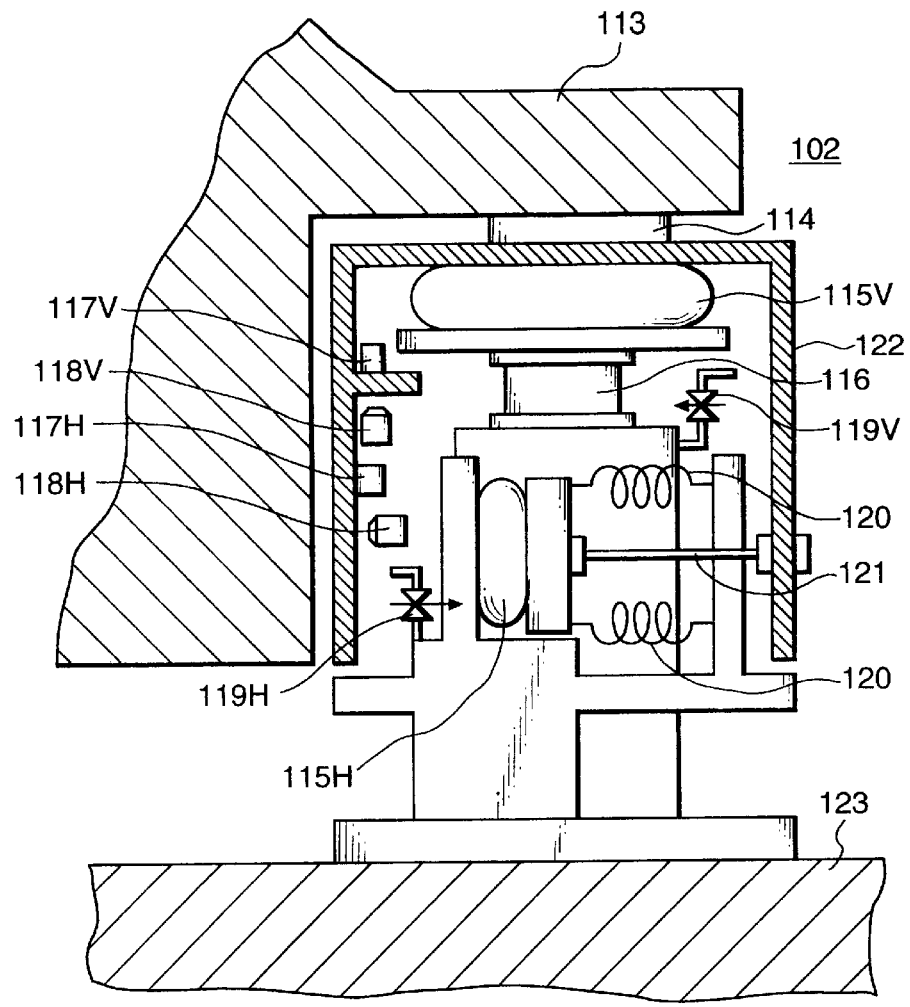
FIG. 16 is a diagram showing the mechanical structure of an active support leg of the anti-vibration apparatus related to FIG. 15.
Figure 17:
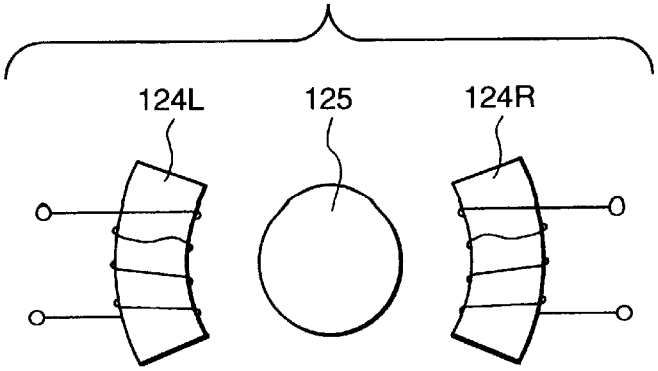
FIG. 17 is a diagram showing a magnetic bearing wherein an electromagnet is disposed in a push-pull layout.

In FIG. 14, there are provided acceleration-related PI compensators 128x, 128y, and 128θz, which are not provided in FIG. 15, at the section preceding the motional mode distributor 111. The reason why they are provided has already been described in conjunction with FIG. 18; therefore, the explanation thereof will be omitted.

In another conceivable configuration as a modification of the embodiment, any active support legs shown in FIG. 20 to FIG. 24, to be discussed later, and the pressure feedback systems may be provided, and the acceleration and position feedback may be both based on motional mode to constitute a decoupling system.

<Modification of the Sixth Embodiment>

Figure 20:
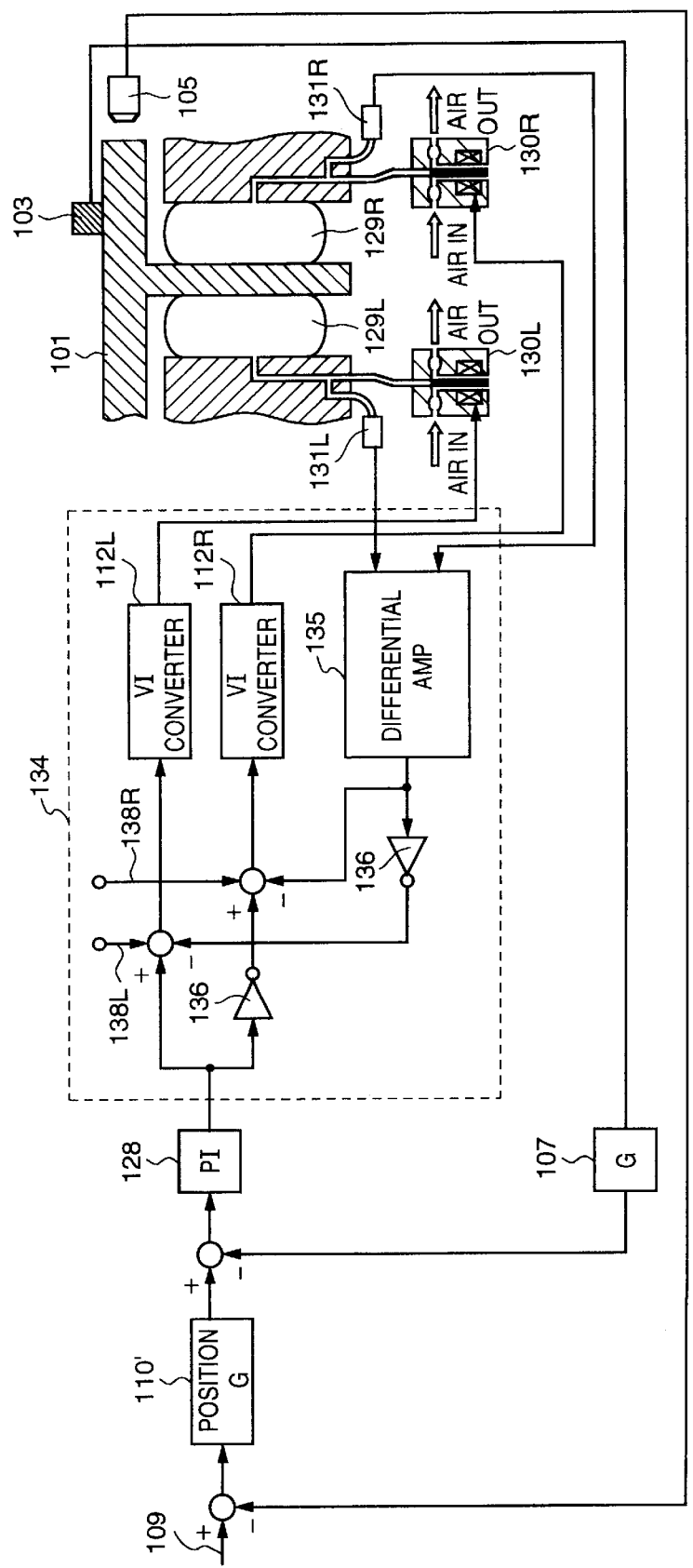
FIG. 20 is a diagram showing the configuration of the control unit when pressure feedback is carried out according to the measurement of differential pressure as a modification example of the sixth embodiment of the present invention.

The control unit shown in FIG. 20 has essentially the same configuration as the control unit of the active support leg shown in FIG. 19 except that servo valves 130R and 130L and pressure gauges 131R and 131L for each pair of the air springs 129R and 129L are provided in place of the differential pressure gauges 131D and the four-way servo valves 130D. The outputs of the pressure gauges 130R and 130L are supplied to a differential amplifier 135 to detect the pressure difference between the air springs 129R and 129L, and the detected pressure difference is negatively fed back to the section preceding voltage-current converters 112R and 112L. Reference numeral 136 in the pressure feedback loop 134 denotes an inverter. As in the case of FIG. 21 through FIG. 24 to be discussed, the rest of the configuration of the acceleration feedback loop and the position feedback loop is the same as that shown in FIG. 19; hence, the explanation thereof will be omitted.

Figure 21:
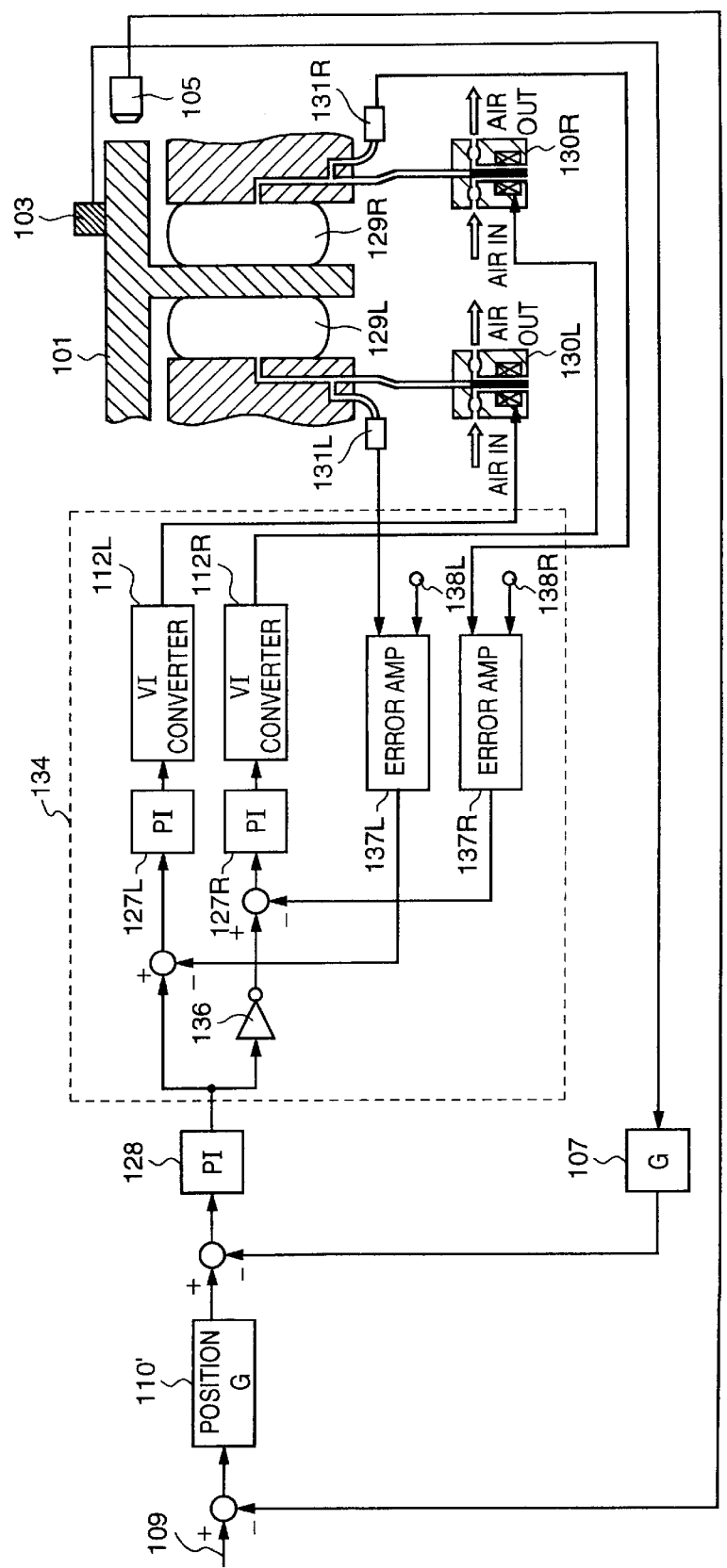
FIG. 21 is a diagram showing the configuration of the control unit wherein pressure feedback is carried out independently for each air spring as another modification example of the sixth embodiment of the present invention.

The control unit illustrated in FIG. 21 is equipped with the servo valves 130R and 130L and pressure gauges 131R and 131L for the air springs 129R and 129L, respectively. According to the configuration of the control unit, independent pressure feedback is applied for each of the air springs 129R and 129L. The internal pressures of the air springs 129R and 129L are measured by the pressure gauges 131R and 131L, respectively, and the measurements are supplied to pressure-related error amplifiers 137R and 137L. Supplied to the error amplifiers 137R and 137L are the voltages to be applied to pressure target voltage input terminals 138R and 138L. The outputs of the error amplifiers 137R and 137L are negatively fed back to the internal terminals of pressure-related PI compensators 127R and 127L provided at the section preceding voltage-current converters 112R and 112L.

Figure 22:
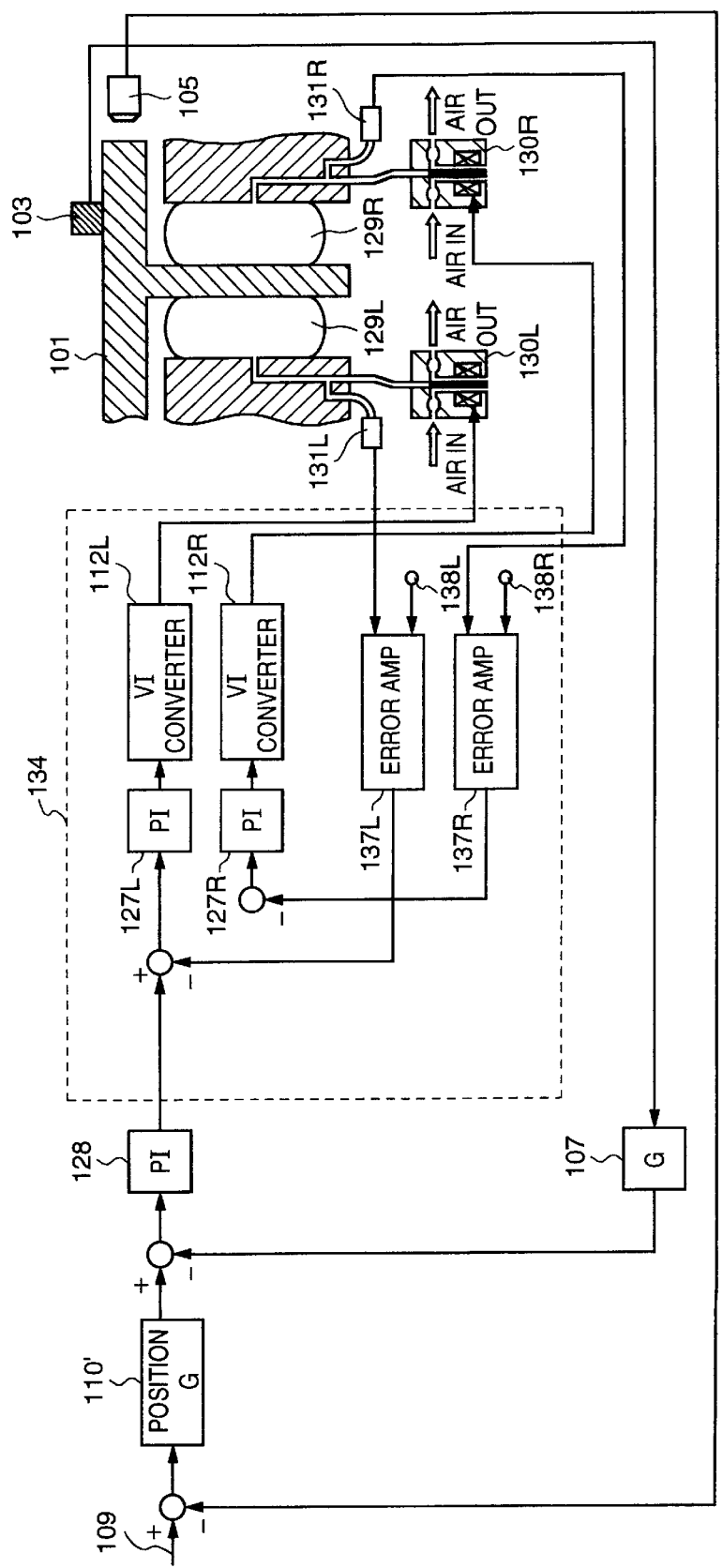
FIG. 22 is a diagram showing the configuration of another control unit wherein pressure feedback is carried out independently for each air spring as yet another modification example of the sixth embodiment of the present invention.

The control unit shown in FIG. 22 is also equipped with the servo valves 130R and 130L for the air springs 129R and 129L and the pressure feedback is applied independently to each air spring; however, it is characterized in that the output of an acceleration-related PI compensator 128 is not applied to the pressure feedback loop provided on the air spring 129R. In this control unit, the signal of the acceleration-related PI compensator 128 is applied only to the pressure feedback loop provided on the air spring 129L to conduct the control. Conversely, the control unit may be configured so that the signal of the PI compensator 128 is applied to the pressure feedback loop provided on the air spring 129R, while only the pressure feedback is applied to the air spring 129L.

Figure 23:
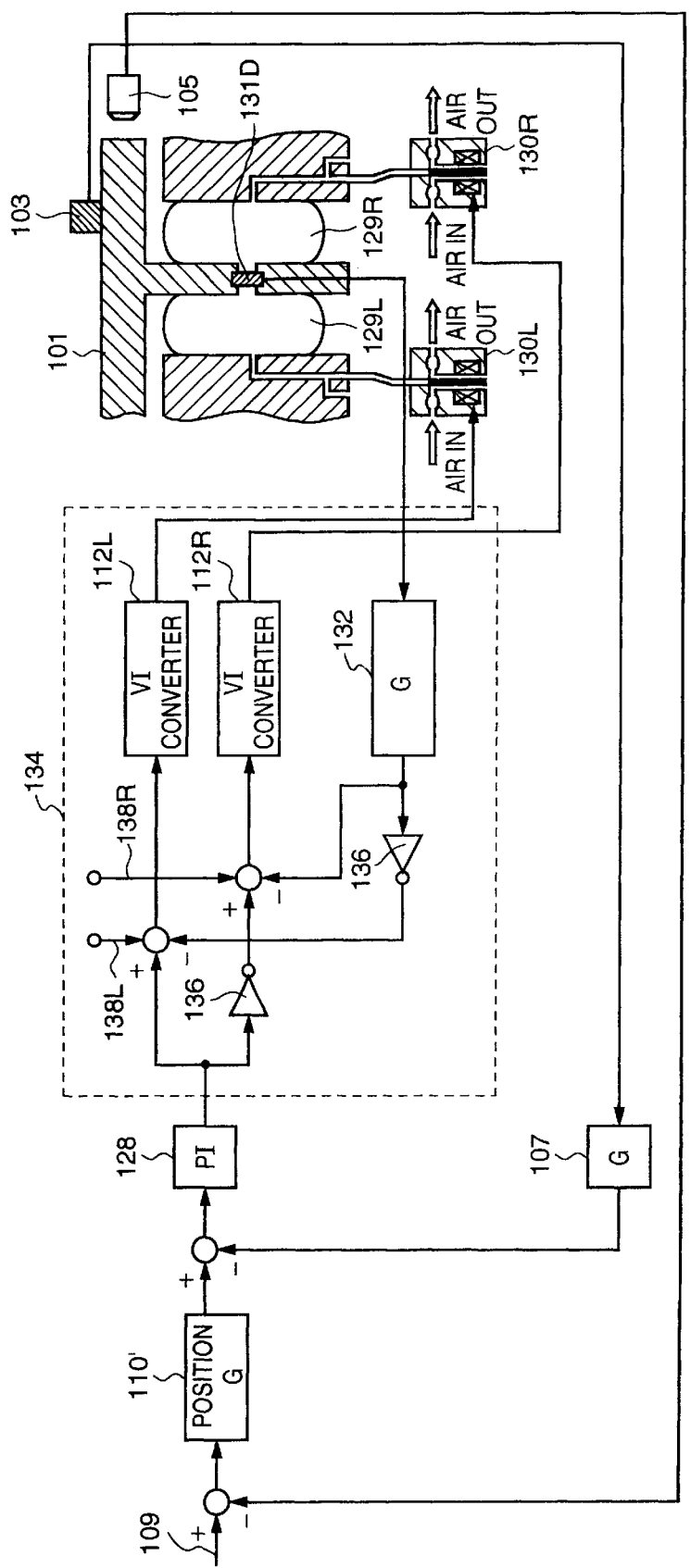
FIG. 23 is a diagram showing the configuration of the control unit wherein pressure feedback based on the measurements of differential pressure is carried out as a further modification example of the sixth embodiment of the present invention.

The control unit illustrated in FIG. 23 is equipped with the servo valves 130R and 130L and the differential pressure gauges 131D for detecting the internal pressure difference between the right and left air springs. The control unit shown in FIG. 21 is provided with the pressure-related PI compensators 127R and 127L at the section preceding the voltage-current converters 112R and 112L, whereas the control unit shown in FIG. 23 has removed the pressure-related PI compensators because of the following reason. Pressure target voltage input terminals 138R and 138L are provided at the section preceding the voltage-current converter 112R and 112L. The PI compensators 127R and 127L have been excluded for the following reason:

when a predetermined target voltage is applied to the voltage-current converters 112R and 112L, this would be regarded as a disturbance if there were the PI compensators. This is because the integrators of the PI compensators act to restrain the bias voltage to be applied to the voltage-current converter 112R and 112L.

The active support legs shown in FIG. 19 through FIG. 23 are provided with the pressure gauges 131R and 131L for measuring the internal pressures of the air springs 129R and 129L, or the differential pressure gauges 131D for measuring the differential pressure between the two air springs. In either case, the physical quantity of the dimension of pressure is measured to apply feedback so as to control the force applied to the anti-vibration table. Hence, more directly, the force actually generated may be detected to implement the feedback to obtain the same effect. An example of the mechanical configuration of the active support leg is illustrated in FIG. 24.

Figure 24:
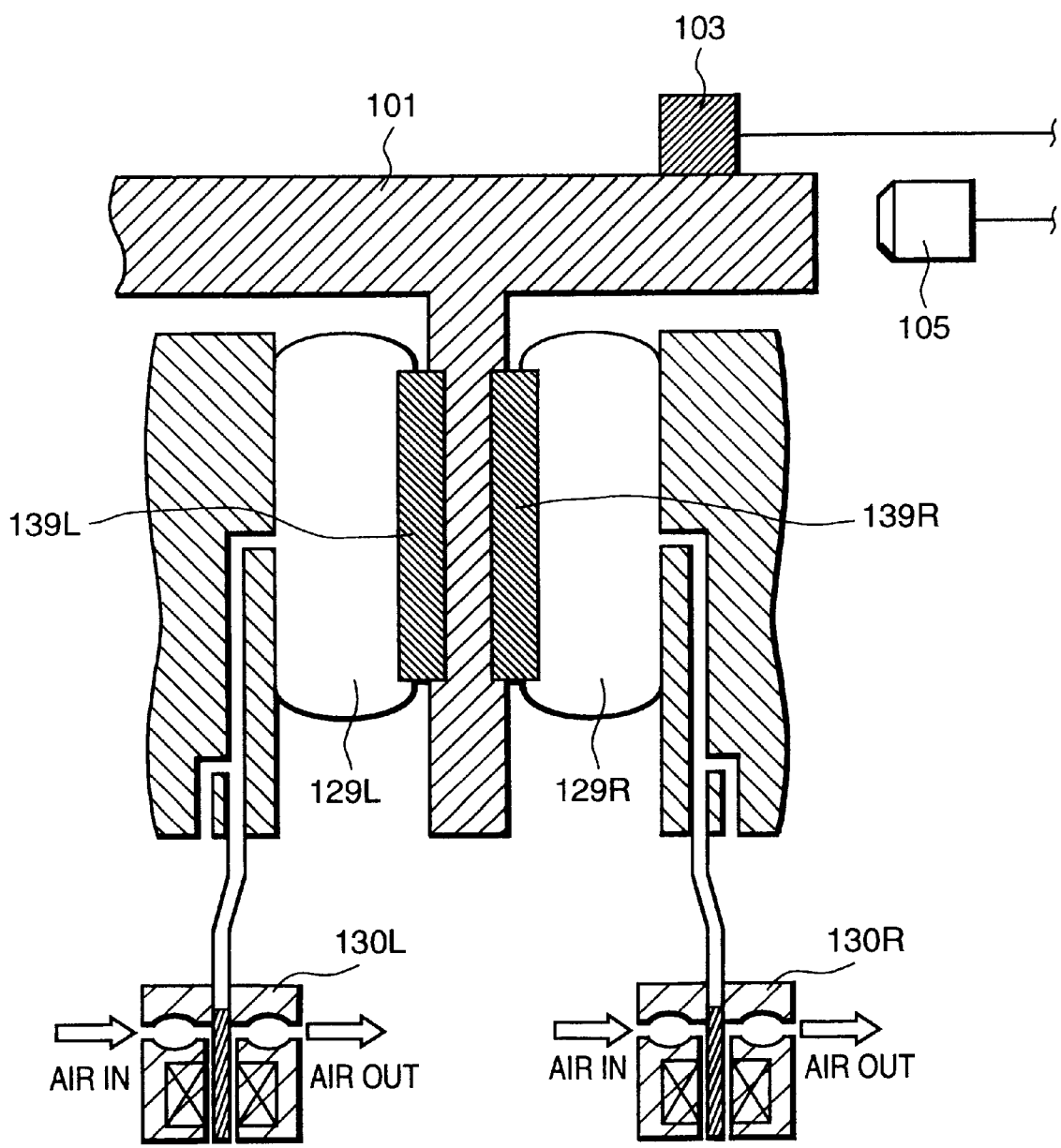
FIG. 24 is a diagram showing a structure of an active support leg having a load sensor as another modification example of the sixth embodiment of the present invention.

In FIG. 24, reference numerals 139R and 139L denote load measurers such as load sensors for detecting the forces generated by the air springs 129R and 129L. In such a configuration of the active support leg, the load measurers simply detect the generated forces, replacing the pressure gauges 131R and 131L or the differential pressure gauges 131D; hence, the configuration of the feedback loop will be identical to those shown in FIG. 19 through FIG. 23.

Thus, according to the apparatus configurations of the embodiments and the modifications thereof, the detailed adjustment of the posture of the anti-vibration table 101 can be achieved by the feedback configuration for each motional mode by controlling the internal pressures or generated forces of a pair of air springs provided in each active support leg through the pressure feedback or load feedback.

In the embodiments, a specific description has been given to the horizontal air spring actuators, and more specifically, to the configuration for supporting the anti-vibration table by using three active support legs. The present invention, however, is not limited thereto; it may be applied also to perpendicular air spring actuators. The present invention does not place any restrictions on the number of active support legs, either. Further, the control units in the embodiments employ analog circuits; it is obvious, however, that they may be partly or entirely replaced by digital arithmetic units.

In the foregoing embodiments, only the air springs are the actuators generating the thrust; however, the present invention may also be applied to a hybrid active anti-vibration apparatus combining an air spring actuator with a linear motor or a voice coil motor, which is a typical electromagnetic motor, or a piezo element or electrostrictive element, which is a typical displacement generating type actuator. In particular, the case where the electromagnetic motor is employed will be described. Normally, the electromagnetic motor is used to provide only the vibration controlling function; it is not expected to provide the positioning function, because using it for positioning would cause the electromagnetic motor to become hot. In other words, the major function of the electromagnetic motor in the anti-vibration apparatus is to implement the damping function. On the other hand, the acceleration feedback functions to impart damping in the configuration of the control unit employing air springs. Therefore, in the hybrid type active anti-vibration apparatus which combines electromagnetic motors with air spring actuators, the stable support of the anti-vibration table can be achieved merely by removing the acceleration feedback in the control unit for the air springs or by applying extremely weak damping thereto. Thus, in the air spring type active anti-vibration apparatus described above also, the acceleration feedback may be removed or extremely weak damping may be applied; and these apparatus configurations also fall within the scope of the present invention.

The embodiments explained above provide the following advantages.

(1) The air spring actuators disposed in the push-pull layout eliminate mechanism components, so that the propagation of floor vibration onto an anti-vibration table can be restrained in comparison with an apparatus equipped with mechanism components.

(2) It is possible to almost entirely eliminate the deformation of an active support leg or the occurrence of mechanical resonance caused by sudden acceleration or deceleration of an XY stage.

(3) In addition to the advantages described above, an ingenious pressure feedback or load feedback is incorporated in the push-pull air spring actuators. This prevents a structure including the anti-vibration table from deforming; hence, the measurement made by the measuring instrument mounted on the anti-vibration table is not disturbed.

(4) Accordingly, when an exposure apparatus is mounted on the structure including the anti-vibration table, good positioning accuracy of the XY stage or the like can be maintained so as to ensure good exposure of semiconductor wafers with resultant higher productivity.

Although the invention has been described in detail above in connection with various preferred embodiments thereof, it will be appreciated by those skilled in the art that these embodiments have been provided solely for purposes of illustration, and are in no way to be considered as limiting the invention. Instead, various modifications and substitutions of equivalent techniques will be readily apparent to those skilled in the art upon reading this specification, and such modifications and substitutions are to be considered as falling within the true scope and spirit of the following claims.

What is claimed is:

1. An anti-vibration apparatus for eliminating the vibration of an anti-vibration table, said anti-vibration apparatus comprising:
    a plurality of active support legs which support said anti-vibration table and which are able to actively operate to control the motion of said anti-vibration table in a horizontal plane;
    control means for controlling the operation of said plurality of active support legs; and
    a plurality of pressure detecting means for detecting the internal pressures of air springs respectively provided in said plurality of active support legs,
    wherein said control means comprises a pressure feedback loop which feeds the signals, which are based on the internal pressures of said air springs detected by said plurality of pressure detecting means, back to a control system of said control means in order to adjust the internal pressures of said air springs according to the detected internal pressures.

2. An anti-vibration apparatus according to claim 1, wherein the air springs provided in each of said plurality of active support legs are a pair of air springs, and further comprising a three-way or four-way type servo valve for supplying or exhausting air, which is a medium for operating the pair of air springs, to or from the air springs, and
    said pressure detecting means detects the differential pressure produced in said pair of air springs by the supply or exhaustion of air by said servo valve; and
    said pressure feedback loop feeds a signal, which is based on the differential pressure detected by said pressure detecting means, back to the control system of said control means.

3. An anti-vibration apparatus according to claim 2, further comprising:
    vibration measuring means for measuring the vibration of said anti-vibration table; and
    position measuring means for measuring the position of said anti-vibration table,
    wherein said control means comprises an acceleration feedback loop for feeding a signal, which corresponds to the acceleration of the vibration of said anti-vibration table which is based on the measurement result given by said vibration measuring means, back to the control system of said control means, and a position feedback loop for feeding a signal, which corresponds to the position of said anti-vibration table measured by said position measuring means, back to the control system of said control means.

4. An anti-vibration apparatus according to claim 2, wherein said acceleration feedback loop and said position feedback loop are decoupling control schemes based on the motional mode of said anti-vibration table, and
    said pressure feedback loop is provided separately for each of said plurality of active support legs.

5. An anti-vibration apparatus according to claim 1, further comprising an exposure apparatus for depositing a predetermined mask pattern on a silicon wafer, said exposure apparatus being mounted on said anti-vibration table.

6. An anti-vibration apparatus according to claim 1, wherein the air springs provided in each of said plurality of active support legs are a pair of air springs, and further comprising a three-way type servo valve for supplying or exhausting air, which is a medium for operating the pair of air springs, to or from the air springs;
    said pressure detecting means detects the pressure produced in said pair of air springs when air is supplied or exhausted by said servo valve; and
    said pressure feedback loop feeds a signal, which corresponds to the differential pressure which is produced between said pair of air springs and which has been calculated according to the pressures which are respectively generated in said pair of air springs and which have been detected by said pressure detecting means, back to the control system of said control means.

7. An anti-vibration apparatus according to claim 6, further comprising:
    vibration measuring means for measuring the vibration of said anti-vibration table; and
    position measuring means for measuring the position of said anti-vibration table,
    wherein said control means further comprises an acceleration feedback loop for feeding a signal, which corresponds to the acceleration of the vibration of said anti-vibration table which is based on the measurement result given by said vibration measuring means, back to the control system of said control means, and a position feedback loop for feeding a signal, which corresponds to the position of said anti-vibration table measured by said position measuring means, back to the control system of said control means.

8. An anti-vibration apparatus according to claim 1, wherein the air springs provided in each of said plurality of active support legs are a pair of air springs, and further comprising a three-way type servo valve for supplying or exhausting air, which is a medium for operating the pair of air springs, to or from the air springs,
    said pressure detecting means detects the pressure produced in said pair of air springs when air is supplied or exhausted by said servo valve, and said pressure feedback loop is provided for each air spring of said pair of air springs and a signal, which corresponds to the pressure generated at each of said pair of air springs and detected by said pressure detecting means, is fed back to the control system of said control means by the pressure feedback loop.

9. An anti-vibration apparatus according to claim 8, further comprising:

vibration measuring means for measuring the vibration of said anti-vibration table; and position measuring means for measuring the position of said anti-vibration table, wherein said control means further comprises an acceleration feedback loop for feeding a signal, which corresponds to the acceleration of the vibration of said anti-vibration table which is based on the measurement result given by said vibration measuring means, back to the control system of said control means, and a position feedback loop for feeding a signal, which corresponds to the position of said anti-vibration table measured by said position measuring means, back to the control system of said control means.

10. An anti-vibration apparatus according to claim 9, wherein, in the control system of said control means, said signal corresponding to the acceleration and said signal corresponding to the position are not applied to either one of said pressure feedback loops provided for each air spring of said pair of air springs.

11. An anti-vibration apparatus for eliminating the vibration of an anti-vibration table, said anti-vibration apparatus comprising:

a plurality of active support legs which support said anti-vibration table and which are able to actively operate to control the motion of said anti-vibration table in a horizontal plane;

control means for controlling the operation of said plurality of active support legs; and a plurality of load measuring means for detecting the load generated by the operation of air springs respectively provided in said plurality of active support legs, wherein said control means comprises a load feedback loop for feeding the signals, which correspond to the loads measured by said plurality of load measuring means, to a control system of said control means in order to adjust the loads produced by the operation of said air springs according to the detected loads.

12. An anti-vibration apparatus according to claim 11, wherein the air springs provided in each of said plurality of active support legs are a pair of air springs, and further comprising a three-way or four-way type servo valve for supplying or exhausting air, which is a medium for operating the pair of air springs, to or from the air springs, said load measuring means detects the load produced by the operation of the pair of air springs for each of said pair of air springs, and said load feedback loop feeds a signal, which corresponds to the load measured by said load measuring means, back to the control system of said control means.

13. An anti-vibration apparatus according to claim 12, further comprising:

vibration measuring means for measuring the vibration of said anti-vibration table; and position measuring means for measuring the position of said anti-vibration table, wherein said control means further comprising an acceleration feedback loop for feeding a signal, which corresponds to the acceleration of the vibration of said anti-vibration table which is based on the measurement result given by said vibration measuring means, back to the control system of said control means, and a position feedback loop for feeding a signal, which corresponds to the position of said anti-vibration table measured by said position measuring means, back to the control system of said control means.

14. An anti-vibration apparatus according to claim 11, wherein said load measuring means is a load sensor.

15. An anti-vibration apparatus according to claim 13, wherein said acceleration feedback loop and said position feedback loop are decoupling control schemes based on the motional mode of said anti-vibration table, and said load feedback loop is provided separately for each of said plurality of active support legs.

16. An anti-vibration apparatus according to claim 11, further comprising an exposure apparatus for depositing a predetermined mask pattern on a silicon wafer, said exposure apparatus being mounted on said anti-vibration table.

17. An anti-vibration apparatus for eliminating the vibration of an anti-vibration table, said anti-vibration apparatus comprising:

a plurality of active support legs which support said anti-vibration table and which can be actively operated by an air spring actuator to control the motion of said anti-vibration table in a horizontal plane;

control means for controlling the operation of said plurality of active support legs; and pressurizing force measuring means for measuring the pressurizing force of said air spring actuator, wherein said control means comprises a pressurizing force feedback loop for feeding a signal, which corresponds to the pressurizing force measured by said pressurizing force measuring means, back to a control system of said control means in order to adjust the pressurizing force of said air spring actuator according to the measured pressurizing force.

18. An anti-vibration apparatus according to claim 17, further comprising:

vibration measuring means for measuring the vibration of said anti-vibration table; and position measuring means for measuring the position of said anti-vibration table, wherein said control means comprises an acceleration feedback loop for feeding a signal, which corresponds to the acceleration of the vibration of said anti-vibration table which is based on the measurement result given by said vibration measuring means, back to the control system of said control means, and a position feedback loop for feeding a signal, which corresponds to the position of said anti-vibration table measured by said position measuring means, back to the control system of said control means, and said control means imparts damping to said anti-vibration table according to said signal based on acceleration and carries out control so as to place said anti-vibration table at a predetermined position according to said signal based on position.

19. An anti-vibration apparatus according to claim 18, wherein said acceleration feedback loop and said position feedback loop are decoupling control schemes based on the motional mode of said anti-vibration table, and said pressurizing force feedback loop is provided separately for said air spring actuator.

20. An anti-vibration apparatus according to claim 18, wherein said pressurizing force measuring means is pressure measuring means for measuring the internal pressure of said air spring actuator, said pressurizing force feedback loop is a pressure feedback system which negatively feeds a signal, which corresponds to the internal pressure of said air spring actuator detected by said pressure measuring means, back to a section preceding a voltage-current converter which drives said air spring actuator, and further comprising a PI compensator which has a zero for canceling the pole of the first-order lag of the pressure feedback system provided at a section preceding said pressure feedback system.

21. An anti-vibration apparatus according to claim 18, wherein said pressurizing force measuring means is pressure measuring means for measuring the load generated by the operation of said air spring actuator, said pressurizing force feedback loop is a pressure feedback system which negatively feeds a signal, which corresponds to the load detected by said pressure measuring means, back to a section preceding a voltage-current converter which drives said air spring actuator, and further comprising a PI compensator which has a zero for canceling the pole of the first-order lag of the pressure feedback system provided at a section preceding said pressure feedback system.

22. An anti-vibration apparatus according to claim 18, wherein said pressurizing force measuring means is pressure measuring means for measuring the internal pressure of said air spring actuator, said pressurizing force feedback loop is a pressure feedback system for supplying an error signal, which is obtained by comparing a signal corresponding to the internal pressure of said air spring actuator detected by said pressure measuring means with a predetermined control signal, to a voltage-current converter, which drives said air spring actuator, via a PI compensator, and in the pressure feedback system, the zero of said PI compensator is set so that it cancels the pole exhibiting the first-order lag frequency characteristic from said voltage-current converter to said pressure measuring means.

23. An anti-vibration apparatus according to claim 18, wherein said pressurizing force measuring means is load measuring means for measuring the load generated by the operation of said air spring actuator, said pressurizing force feedback loop is a load feedback system for supplying an error signal, which is obtained by comparing a signal corresponding to the load detected by said pressure measuring means with a predetermined control signal, to a voltage-current converter, which drives said air spring actuator, via a PI compensator, and in the load feedback system, the zero of said PI compensator is set so that it cancels the pole exhibiting the first-order lag frequency characteristic from said voltage-current converter to said load measuring means.

24. An anti-vibration apparatus according to claim 18, wherein, when said PI compensator is provided at the section preceding the junction point of said pressurizing force feedback loop and said acceleration feedback loop and/or said position feedback loop, a position error compensator for said position feedback loop is a PI compensator or a gain compensator.

25. An anti-vibration apparatus according to claim 17, further comprising:

floor vibration measuring means for measuring the vibration of the floor on which said anti-vibration apparatus is installed;

a floor vibration feedforward compensator which issues a feedforward signal to the control system of said control means according to a measurement result given by said floor vibration measuring means; and a reaction force feedforward compensator which issues a feedforward signal, which is based on the reaction force generated by the driving force of an apparatus mounted on said anti-vibration table, to the control system of said control means in accordance with a drive signal of said apparatus, wherein the feedforward signals issued by said floor vibration feedforward compensator and said reaction force feedforward compensator are applied to the section preceding said pressurizing force feedback loop in the control system of said control means.

26. An anti-vibration apparatus according to claim 25, wherein said floor vibration feedforward compensator includes PI compensators connected in a double-stage cascade, the zero of one of the PI compensators is set to cancel the pole acting as the first-order lag system of said pressurizing force feedback loop, and the zero of the other PI compensator is set to $-K/C$ where C denotes the viscosity damping coefficient of said anti-vibration table, and K denotes the spring constant of said air spring actuator.

27. An anti-vibration apparatus according to claim 25, wherein said floor vibration feedforward compensator includes an integrator and a PI compensator in a cascade connection, and the zero of the PI compensator is set so as to cancel the pole acting as the first-order lag system of said pressurizing force feedback loop.

28. An anti-vibration apparatus according to claim 25, wherein said reaction force feedforward compensator is a phase lead compensator, and the zero of the phase lead compensator is set to cancel the pole acting as the first-order lag system of said pressurizing force feedback loop, and the pole of the phase lead compensator is set to have a break point in a high-frequency zone.

29. An anti-vibration method for an anti-vibration apparatus for eliminating the vibration of an anti-vibration table by controlling the motion of a plurality of active support legs, which support said anti-vibration table and which are able to actively operate, in a horizontal plane, said anti-vibration method comprising:

a pressure detecting step for detecting the internal pressures of the air springs provided respectively in said plurality of active support legs; and a control step for feeding the signals, which are based on the internal pressures of said air springs detected in said pressure detection step, back to a control system of said anti-vibration apparatus in order to adjust the internal pressures of said air springs according to the detected internal pressures.

30. An anti-vibration method according to claim 29, wherein, when the air springs provided in each of said plurality of active support legs are a pair of air springs, and there is provided a three-way or four-way type servo valve for supplying or exhausting air, which is a medium for operating the pair of air springs, to or from the air springs, said pressure detecting step detects the differential pressure produced in said pair of air springs when air is supplied or exhausted by said servo valve, and said control step feeds a signal, which is based on the differential pressure detected in said pressure detecting step, back to the control system of said anti-vibration apparatus.

31. An anti-vibration method according to claim 30, further comprising:

a vibration measurement step for measuring the vibration of said anti-vibration table; and a position measuring step for measuring the position of said anti-vibration table, wherein said control step feeds a signal, which corresponds to the acceleration of the vibration of said anti-vibration table which is based on the measurement result obtained in said vibration measurement step and a signal, which corresponds to the position of said anti-vibration table measured in said position measurement step, back to the control system of said anti-vibration apparatus.

32. An anti-vibration method according to claim 29, wherein, when the air springs provided in each of said plurality of active support legs are a pair of air springs, and there is provided a three-way type servo valve for supplying or exhausting air, which is a medium for operating the pair of air springs, to or from the air springs, said pressure detection step detects the pressure produced in said pair of air springs when air is supplied or exhausted by said servo valve, and said control step feeds a signal, which corresponds to the differential pressure which is produced between said pair of air springs and which has been calculated according to the pressures which are respectively generated at said pair of air springs and which have been detected in said pressure detection step, back to the control system of said anti-vibration apparatus.

33. An anti-vibration method according to claim 32, further comprising:

a vibration measuring step for measuring the vibration of said anti-vibration table; and a position measuring step for measuring the position of said anti-vibration table, wherein said control step feeds a signal, which corresponds to the acceleration of the vibration of said anti-vibration table which is based on the measurement result given in said vibration measurement step, and a signal, which corresponds to the position of said anti-vibration table measured in said position measurement step, back to the control system of said anti-vibration apparatus.

34. An anti-vibration method according to claim 29, wherein, when the air springs provided in each of said plurality of active support legs are a pair of air springs, and there is provided a three-way type servo valve for supplying or exhausting air, which is a medium for operating the pair of air springs, to or from the air springs, said pressure detection step detects the pressure produced in said pair of air springs when air is supplied or exhausted by said servo valve, and said control step feeds a signal, which corresponds to the pressure generated at each of said pair of air springs and detected in said pressure detection step, back to the control system of said anti-vibration apparatus.

35. An anti-vibration method according to claim 34, further comprising:

a vibration measurement step for measuring the vibration of said anti-vibration table; and a position measurement step for measuring the position of said anti-vibration table, wherein said control step feeds a signal, which corresponds to the acceleration of the vibration of said anti-vibration table which is based on the measurement result obtained in said vibration measurement step, and a signal, which corresponds to the position of said anti-vibration table measured in said position measurement step, back to the control system of said anti-vibration apparatus.

36. An anti-vibration method for an anti-vibration apparatus for eliminating the vibration of an anti-vibration table by controlling the motion of a plurality of active support legs, which support said anti-vibration table and which are able to actively operate, in a horizontal plane, said anti-vibration method comprising:

a plurality of load measurement steps for detecting the loads generated by the operation of the air springs provided respectively in said plurality of active support legs; and a control step for feeding the signals, which are based on the loads measured in said load measurement steps, back to a control system of said anti-vibration apparatus in order to adjust the loads produced by the operation of said air springs according to the detected loads.

37. An anti-vibration method according to claim 36, wherein, when the air springs provided in each of said plurality of active support legs are a pair of air springs, and there is provided a three-way or four-way type servo valve for supplying or exhausting air, which is a medium for operating the pair of air springs, to or from the air springs, said load measurement steps detect the load produced by the operation of said pair of air springs for each of said air springs, and said control step feeds a signal, which is based on the load measured in said load measurement step, back to the control system of said anti-vibration apparatus.

38. An anti-vibration method according to claim 37, further comprising:

a vibration measurement step for measuring the vibration of said anti-vibration table; and a position measuring step for measuring the position of said anti-vibration table, wherein said control step feeds a signal, which corresponds to the acceleration of the vibration of said anti-vibration table which is based on the measurement result obtained in said vibration measurement step and a signal, which corresponds to the position of said anti-vibration table measured in said position measurement step, back to the control system of said anti-vibration apparatus.

39. An anti-vibration method for an anti-vibration apparatus for eliminating the vibration of an anti-vibration table by controlling the motion of a plurality of active support legs, which support the anti-vibration table and which can be actively operated by air spring actuators, in a horizontal plane, said anti-vibration method comprising:

a pressurizing force measurement step for measuring the pressurizing forces of said air spring actuators; and a control step for feeding the signals, which are based on the pressurizing forces measured in said pressurizing force measurement step, to a control system of said anti-vibration apparatus in order to adjust the pressurizing forces of said air spring actuators according to the measured pressurizing forces.

40. An anti-vibration method according to claim 39, further comprising:

a vibration measurement step for measuring the vibration of said anti-vibration table; and a position measurement step for measuring the position of said anti-vibration table, wherein said control step feeds a signal, which corresponds to the acceleration of the vibration of said anti-vibration table which is based on the measurement result obtained in said vibration measurement step, back to the control system of said anti-vibration apparatus so as to impart damping to said anti-vibration table in accordance with the signal based on the acceleration, and feeds a signal, which corresponds to the position of said anti-vibration table measured in said position measurement step, back to the control system of said anti-vibration apparatus so as to place said anti-vibration table at a predetermined position in accordance with the signal based on the position.

41. An anti-vibration apparatus comprising:

an anti-vibration table;

a plurality of air springs which support said anti-vibration table and which are able to actively operate by air being supplied to or exhausted from said air springs;

a plurality of position detectors which detect a position of said anti-vibration table;

a plurality of vibration detectors which detect vibration of said anti-vibration table;

a plurality of pressure detectors which detect internal pressures of said air springs; and a controller which controls, for eliminating the vibration of said anti-vibration table, the operation of said air springs on the basis of output signals from said position detectors, vibration detectors and pressure detectors.

42. An anti-vibration apparatus comprising:

an anti-vibration table;

a plurality of air springs which support said anti-vibration table and which are able to actively operate by air being supplied to or exhausted from said air springs;

a plurality of position detectors which detect a position of said anti-vibration table;

a plurality of vibration detectors which detect vibration of said anti-vibration table;

a plurality of load detectors which detect a load generated by the operation of said air springs; and a controller which controls, for eliminating the vibration of said anti-vibration table, the operation of said air springs on the basis of output signals from said position detectors, vibration detectors and load detectors.

43. An anti-vibration apparatus comprising:

an anti-vibration table;

a plurality of air springs which support said anti-vibration table and which are able to actively operate by air being supplied to or exhausted from said air springs;

a plurality of position detectors which detect a position of said anti-vibration table;

a plurality of vibration detectors which detect vibration ofsaid anti-vibration table;

a plurality of pressurizing force detectors which detect a pressurizing force of said air spring; and a controller which controls, for eliminating the vibration of said anti-vibration table, the operation of said air springs on the basis of output signals from said position detectors, vibration detectors and pressurizing force detectors.

44. An anti-vibration method for an anti-vibration apparatus for eliminating vibration of an anti-vibration table by controlling the motion of a plurality of air springs, which support said anti-vibration table and which are able to actively operate by air being supplied to or exhausted from the air springs, said anti-vibration method comprisings:

a position detecting step for detecting a position of the anti-vibration table;

a vibration detecting step for detecting vibration of the anti-vibration table;

a pressure detecting step for detecting internal pressures of the air springs; and a contol step for controlling the operation of the air springs on the basis of results of the detected position of the anti-vibration table, the detected vibration of the anti-vibration table and the detected internal pressures of the air springs.

45. An anti-vibration method for an anti-vibration apparatus for eliminating vibration of an anti-vibration table by controlling the motion of a plurality of air springs, which support the anti-vibration table and which are able to actively operate by air springs, said anti-vibration method comprising:

a position detecting step for detecting a position of the anti vibration table;

a vibration detecting step for detecting vibration of the anti-vibration table;

a load detecting step for detecting a load generated by the operation of the air springs; and a control step for controlling the operation of the air springs on the basis of results of the detected position of the anti-vibration table, the detected vibration of the anti-vibration table and the detected load of the air springs.

46. An anti-vibration method for an anti-vibration apparatus for eliminating vibration of an anti-vibration table by controlling the motion of a plurality of air springs, which support the anti-vibration table and which are able to actively operate by air being supplied to or exhausted from the air springs, said anti-method comprising:

a position detecting step for detecting a position of the anti-vibration table;

a vibration detecting step for detecting vibration of the anti-vibration table;

a pressurizing force detecting step for detecting a pressurizing force of the air springs; and a control step for controlling the operation of the air springs on the basis of results of the detected position of the anti-vibration table, the detected vibration of the anti-vibration table and the detected pressurizing force of the air springs.

* * * * *

UNITED STATES PATENT AND TRADEMARK OFFICE
CERTIFICATE OF CORRECTION

PATENT NO. : 6,170,622 B1
DATED : January 9, 2001
INVENTOR(S) : Shinji Wakui et al.

It is certified that error appears in the above-identified patent and that said Letters Patent is hereby corrected as shown below:

Title page between [73] and [*],
Insert -- [*] Notice: This patent issued on a continued prosecution application filed under 37 CFR 1.53(d). and is subject to the twenty year patent term provisions of 35 U.S.C. § 154(a)(2). --.

Column 12,
Line 47, "t o" should read -- to --.

Column 16,
Line 11, "remains as" should be deleted.
Line 12, "approximately" should read -- approximate --.

Column 19,
Line 31, "uf" should read -- $u_f$ --.

Column 33,
Line 66, "comprising" should read -- comprises --.

Column 34,
Line 36, "comprises" should read -- further comprises --.

Column 40,
Line 2, "ofsaid" should read -- of said --.
Line 4, "spring;" should read -- springs; --.
Line 34, "anti" should read -- anti --.
Line 51, "anti-method" should read -- anti-vibration method --.

Signed and Sealed this

Eleventh Day of December, 2001

Attest:

NICHOLAS P. GODICI
*Attesting Officer*    *Acting Director of the United States Patent and Trademark Office*